United States Patent
Yang et al.

(10) Patent No.: US 9,997,360 B2
(45) Date of Patent: Jun. 12, 2018

(54) METHOD FOR MITIGATING LAYOUT EFFECT IN FINFET

(71) Applicant: QUALCOMM Incorporated, San Diego, CA (US)

(72) Inventors: Da Yang, San Diego, CA (US); Yanxiang Liu, San Diego, CA (US); Jun Yuan, San Diego, CA (US); Kern Rim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days. days.

(21) Appl. No.: 15/271,867

(22) Filed: Sep. 21, 2016

(65) Prior Publication Data

US 2018/0082846 A1    Mar. 22, 2018

(51) Int. Cl.
*H01L 29/76*   (2006.01)
*H01L 21/28*   (2006.01)
*H01L 29/78*   (2006.01)
*H01L 29/06*   (2006.01)
*H01L 29/66*   (2006.01)
*H01L 21/3213*   (2006.01)

(52) U.S. Cl.
CPC .. *H01L 21/28123* (2013.01); *H01L 21/32139* (2013.01); *H01L 29/0653* (2013.01); *H01L 29/66545* (2013.01); *H01L 29/7851* (2013.01)

(58) Field of Classification Search
CPC ............. H01L 51/5016; H01L 51/5088; H01L 51/0072; H01L 51/5056; C09K 11/06
USPC ........................................................ 257/401
See application file for complete search history.

(56) References Cited

U.S. PATENT DOCUMENTS

| | | | |
|---|---|---|---|
| 9,054,127 B2 | 6/2015 | Jagannathan et al. | |
| 9,117,886 B2 | 8/2015 | Lin et al. | |
| 9,263,252 B2 | 2/2016 | Chang et al. | |
| 9,379,104 B1 | 6/2016 | Wu | |
| 9,627,474 B2 * | 4/2017 | Wang | H01L 29/0638 |
| 2003/0141543 A1 * | 7/2003 | Bryant | H01L 29/66772 257/347 |
| 2013/0309856 A1 | 11/2013 | Jagannathan et al. | |
| 2015/0221761 A1 * | 8/2015 | Tan | H01L 29/785 257/347 |
| 2016/0056181 A1 | 2/2016 | Anderson et al. | |
| 2016/0104788 A1 | 4/2016 | Ryu et al. | |

OTHER PUBLICATIONS

International Search Report and Written Opinion—PCT/US2017/048841—ISA/EPO—dated Nov. 27, 2017.

* cited by examiner

*Primary Examiner* — Andy Huynh
(74) *Attorney, Agent, or Firm* — Muncy, Geissler, Olds & Lowe, P.C.

(57) ABSTRACT

Multigate devices and fabrication methods that mitigate the layout effects are described. In conventional processes to fabricate multigate semiconductor devices such as FinFET devices, long isolation cut masks may be used. This can lead to undesirable layout effects. To mitigate or eliminate the layout effect, fabrication methods are proposed in which the interlayer dielectric (ILD) layer remains intact at the gate cut location during the fabrication process.

15 Claims, 29 Drawing Sheets

US 9,997,360 B2

METHOD FOR MITIGATING LAYOUT EFFECT IN FINFET

FIELD OF DISCLOSURE

The field of the disclosed subject matter generally relates to fabrication of semiconductor devices. In particular, the field of the disclosed subject matter relates to fabrication of multigate transistor devices such as fin-shaped field effect transistor (FinFET) devices to mitigate layout effects.

BACKGROUND

Multigate transistors have been implemented in integrated circuit chips for area efficiency. Examples of multigate transistors include fin-shaped field effect transistors (Fin-FETs) having multiple fins disposed on two sides of a gate stripe, with fins on one side of the gate stripe serving as sources and fins on the other side of the gate stripe serving as drains. Examples of typical FinFET devices include devices in which transistor arrays are formed by multiple gate stripes in parallel with one another, which are positioned perpendicular to multiple oxide diffusion stripes in parallel with one another. The oxide diffusion stripes are positioned like fins on two sides of each gate stripe. Each pair of source and drain and a portion of the gate stripe between such pair of source and drain may be implemented as an individual transistor.

FIG. 1A illustrates a conventional design for fabricating FinFETs. In this figure, two FinFET cells are illustrated as dashed boxes. Shapes for a gate cut 110 and an isolation cut 120 are also illustrated. The isolation cut 120 is an isolation structure within an active region where the dummy poly-silicon gates and the silicon underneath the gates are removed and filled with dielectrics. The isolation cut 120, which is oriented in the gate stripe direction, is the mask name on the location where a single diffusion break (SDB) process is performed. SDB is kind of isolation by digging trench at the gate region and deep into the silicon fin, and filling the trench with dielectrics. The gate cut is used to cut poly-silicon gates. The gate cut 110, which is oriented in the fin direction, is the mask name on the location where gate is cut. The gate and isolation cuts 110, 120 are locations of fabrication cuts along a gate of the FinFET. The gate cuts 110 are parallel with the fin stripes of the FinFET and the isolation cuts 120 are parallel with the gate stripes of the FinFET.

As illustrated in FIG. 1A, the gate and isolation cuts 110, 120 are separated from each other in the FinFET fabrication by design. But in practice, the conventional isolation cuts 120 are merged often due to lithography process limitations as illustrated in FIG. 1B. For example, the gate cut 110 can be very narrow (e.g., as small as 30 nm), such that the integrity of the conventional lithography process can be compromised.

FIG. 1C illustrate a simplified designed separation between the gate and the isolation cuts, 110, 120. As seen, the design is that one isolation cut 120 is above the gate cut 110 and another isolation cut 120 is below the gate cut 110, and the two isolation cuts 120 are separated from each other. But again, due to lithography processing integrity issues, a long isolation cut mask 125 is used conventionally for processing as illustrated in FIG. 1D. FIG. 1D also illustrates a gate cut mask 115 also used for processing.

When the long isolation cut mask 125 is used, the interlayer dielectric layer corresponding to the junction between the gate cut mask 115 and the isolation cut mask 125 is etched. This unfortunately has the effect of introducing stresses in later processing. The break of the active region and the surrounding inter-layer-dielectric (ILD) causes strain accumulation at the region. For example the PFET adjacent to the isolation cut is usually impacted by compressive strain, and causes threshold voltage Vt of the PFET to be lowered from a target Vt. Also, as the isolation cut length is increased, this has the effect of lowering the threshold voltage from the target even further. In other words, $\Delta Vt$, which is the deviation from the target, may increase as the isolation cut length increases. Such layout effects are generally undesirable.

SUMMARY

This summary identifies features of some example aspects, and is not an exclusive or exhaustive description of the disclosed subject matter. Whether features or aspects are included in, or omitted from this Summary is not intended as indicative of relative importance of such features. Additional features and aspects are described, and will become apparent to persons skilled in the art upon reading the following detailed description and viewing the drawings that form a part thereof.

An exemplary method for forming a semiconductor device is disclosed. The method may comprise forming a shallow trench isolation (STI) layer on a substrate, forming first and second dummy gates on the STI layer, and forming an interlayer dielectric (ILD) layer on the STI layer. The ILD layer may correspond to a gate cut region and may separate the first and second dummy gates. The method may also comprise forming a first mask on the first and second dummy gates and on the ILD layer. The first mask may have a trench corresponding to an isolation cut region. The trench may expose the first and second dummy gates and the ILD layer. The gate cut and isolation cut regions may intersect. The method may further comprise forming a second mask on the first mask and on the ILD layer exposed by the trench, removing the first and second dummy gates, and removing the first and second masks. The first and second masks may be removed such that the ILD layer remains on the STI layer. The method may yet further comprise filling regions left by the removed first and second dummy gates.

Another exemplary method for forming a semiconductor device is disclosed. The method may comprise forming a shallow trench isolation (STI) layer on a substrate, forming first and second dummy gates on the STI layer, and forming an interlayer dielectric (ILD) layer on the STI layer. The ILD layer may correspond to a gate cut region and may separate the first and second dummy gates. The method may also comprise forming a first mask on the first and second dummy gates and on the ILD layer, and forming a second mask on the first mask. The second mask may correspond to the gate cut region such that a portion of the first mask outside of the gate cut region is exposed. The method may further comprise removing the exposed portion of the first mask and the second mask. In doing so, a portion of the first mask corresponding to the gate cut region may remain on the ILD layer. The method may yet further comprise removing the first and second dummy gates, removing the first mask such that the ILD layer remains on the STI layer, and filling regions left by the removed first and second dummy gates.

An exemplary semiconductor device is disclosed. The semiconductor device may comprise a shallow trench isolation (STI) layer on a substrate and an interlayer dielectric (ILD) layer on the STI layer. The ILD layer may correspond to a gate cut region. The semiconductor device may also comprise a filling on the STI layer on both sides of the ILD layer including both sides of the ILD layer corresponding to an isolation cut region. The gate cut region and the isolation cut region may intersect each other at a junction, and the ILD layer may be continuous through the junction.

BRIEF DESCRIPTION OF THE DRAWINGS

The accompanying drawings are presented to aid in the description of examples of one or more aspects of the disclosed subject matter and are provided solely for illustration of the examples and not limitation thereof.

FIGS. 2A-11A, 2B-11B and 2C-11C illustrate different stages of a first example process to fabricate a semiconductor device;

FIGS. 12A-22A, 12B-22B and 12C-22C illustrate different stages of a second example process to fabricate a semiconductor device;

DETAILED DESCRIPTION

Aspects of the subject matter are provided in the following description and related drawings directed to specific examples of the disclosed subject matter. Alternates may be devised without departing from the scope of the disclosed subject matter. Additionally, well-known elements will not be described in detail or will be omitted so as not to obscure the relevant details.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments of the disclosed subject matter include the discussed feature, advantage or mode of operation.

The terminology used herein is for the purpose of describing particular examples only and is not intended to be limiting. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, processes, operations, elements, and/or components, but do not preclude the presence or addition of one or more other features, integers, processes, operations, elements, components, and/or groups thereof.

Further, many examples are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects may be embodied in a number of different forms, all of which have been contemplated to be within the scope of the claimed subject matter. In addition, for each of the examples described herein, the corresponding form of any such examples may be described herein as, for example, "logic configured to" perform the described action.

Figure 1A:
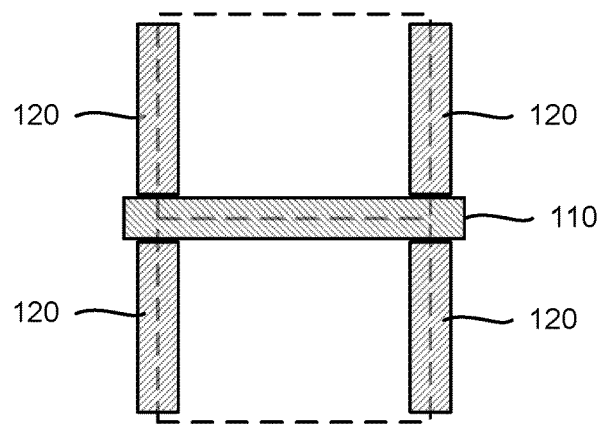
FIGS. 1A and 1C illustrate conventional designs for fabricating FinFET cells showing designed separation between isolation and gate cuts.
Figure 1B:
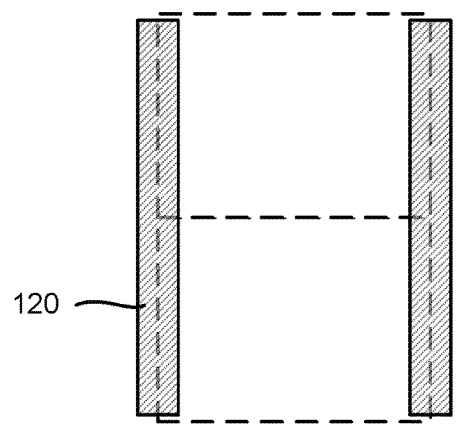
FIGS. 1B and 1D illustrate conventional FinFET cells fabrication process in which the isolation cuts are merged.
Figure 1C:
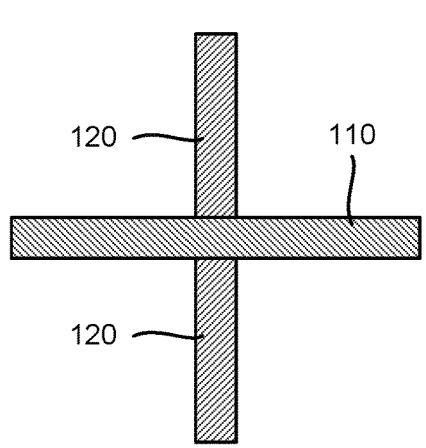
Figure 1D:
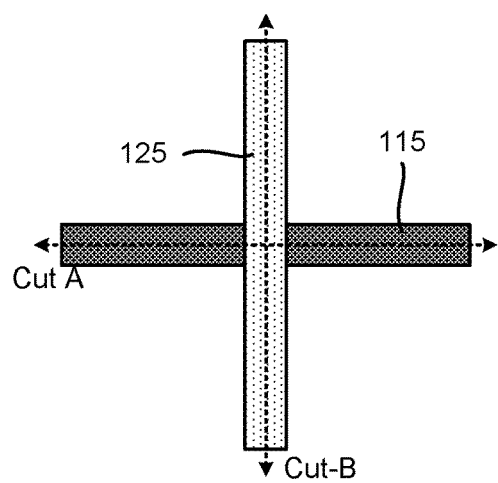

As indicated above, conventional FinFET fabrication processes typically include using the long isolation cut mask 125 illustrated in FIG. 1D. In the conventional fabrication process, using the long isolation cut mask 125 can lead to undesirable layout effects including introducing stresses due to the underlying interlayer dielectric being etched during fabrication as well as increasing the deviation from the desired threshold voltage Vt.

However, in a non-limiting aspect, it is proposed to change the fabrication process to keep the ILD layer at the gate cut location intact during the fabrication process. Referring to FIG. 1D, it is seen that the gate cut mask 115 and the isolation cut mask 125 intersect at a junction. In the proposed aspect, the same gate cut and isolation cut masks 115, 125 may be used. In other words, the masks used in the conventional fabrication processing can be reused. This has the advantage that significant redesign and/or retooling can be avoided. The gate cut and isolation cut masks 115, 125 may be substantially perpendicular to each other, and thus the gate cut and isolation cut regions may also be substantially perpendicular to each other.

In the non-limiting aspect, it is proposed to maintain at least the ILD layer intact in an area corresponding to the junction between the gate cut and isolation cut masks 115, 125 during the fabrication process. In other words, the ILD layer may remain continuous through the junction. By maintaining the ILD layer intact, the undesirable layout effects may be mitigated or even eliminated.

FIGS. 2A-11A, 2B-11B and 2C-11C illustrate different stages of a first example process to fabricate a semiconductor device. An example is a FinFET device. Note that in FIG. 1D, the gate cut direction refers to the orientation of the gate cut mask 115 (indicated with a horizontal double-ended arrow) and the isolation cut direction refers to the orientation of the isolation cut mask 125 (indicated with a vertical double-ended arrow). Also, the gate cut and isolation cut regions may be used respectively to refer to the region/area of the gate cut mask 115 and the isolation cut mask 125.

FIGS. 2A-11A illustrate side views of the semiconductor device fabrication stages along the gate cut region and FIGS. 2B-11B illustrate side views of the semiconductor device fabrication stages along the isolation cut region. While not specifically indicated, in FIGS. 2A-11A, the gate cut direction may correspond to the left/right direction and the isolation cut direction may correspond to the in/out direction of the viewing surface. In FIGS. 2B-11B, the gate cut direction may correspond to the in/out direction and the isolation cut direction may correspond to the left/right direction of the viewing surface.

FIGS. 2C-11C illustrate top views of the semiconductor device fabrication stages. While not specifically indicated, the gate cut direction may correspond to the left/right direction and the isolation cut direction may correspond to the up/down direction of the viewing surface. Moreover, the gate cut region (region occupied by the gate cut mask 115) may be viewed as corresponding to a center horizontal portion and the isolation cut region (region occupied by the isolation cut mask 115) may be viewed as corresponding to a center vertical portion in these figures.

Figure 2A:
Figure 2B:
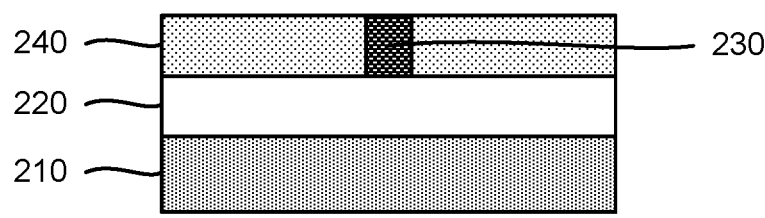
Figure 2C:
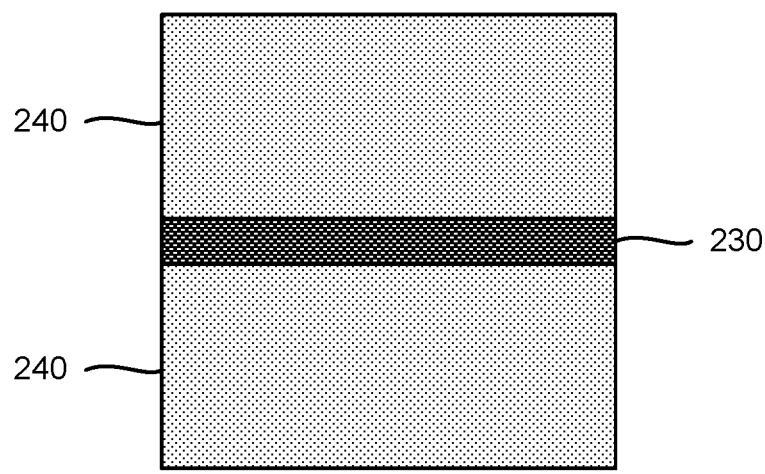

FIGS. 2A, 2B and 2C illustrate a fabrication stage in which a substrate 210 (e.g., Si substrate) may be formed, a shallow trench isolation (STI) layer 220 (e.g., SiN, SiO) may be formed on the substrate 210, an interlayer dielectric (ILD) 230 (e.g., an oxide layer including $SiO_2$) may be formed on the STI layer 220 and dummy gates 240 may also be formed on the STI layer 220. The STI layer 220 may be viewed as an example of means for providing electrical isolation. The ILD layer 230 may be formed corresponding to the gate cut region. That is, the ILD layer 230 may be formed in an area that vertically overlaps the gate cut mask 115 (not shown in FIGS. 2A, 2B and 2C). For example, in the top view of the stage illustrated in FIG. 2C, that the ILD layer 230 is shown as occupying the center horizontal portion. The ILD layer 230 may separate the dummy gates 240 formed on either side of the ILD layer 230. The two dummy gates 240 may be referred to as first and second dummy gates 240.

Figure 3A:
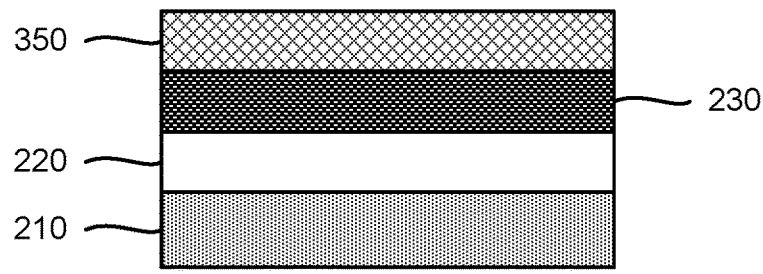
Figure 3B:
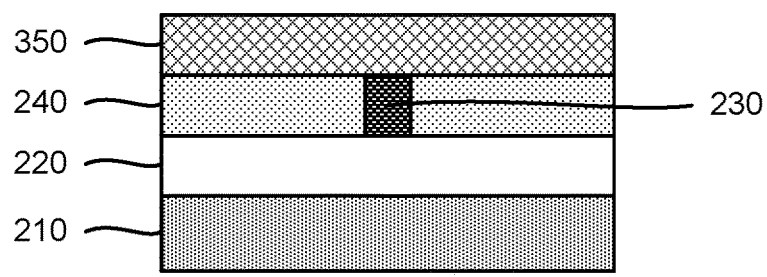
Figure 3C:
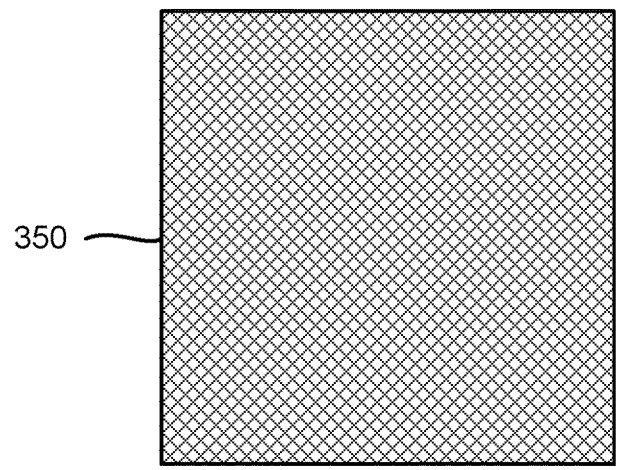

FIGS. 3A, 3B and 3C illustrate a stage in which a first mask 350 may be formed over the ILD layer 230 and the first and second dummy gates 240. The first mask 350 may be a hardmask. Hardmasks may be formed from materials such as silicon nitride and silicon oxide. Typically, deposited films are considered hard, while spin-on polymers or organic films are considered soft. Softmasks such as polymers tend to be etched easily by reactive gases (e.g., oxygen, fluorine and chlorine) such that softmask patterns can rapidly degrade during plasma etching. Hardmasks provide another etching selectivity different from photoresist such that double patterning (pattern with phtotoresist on top of hardmask) is possible.

Figure 4A:
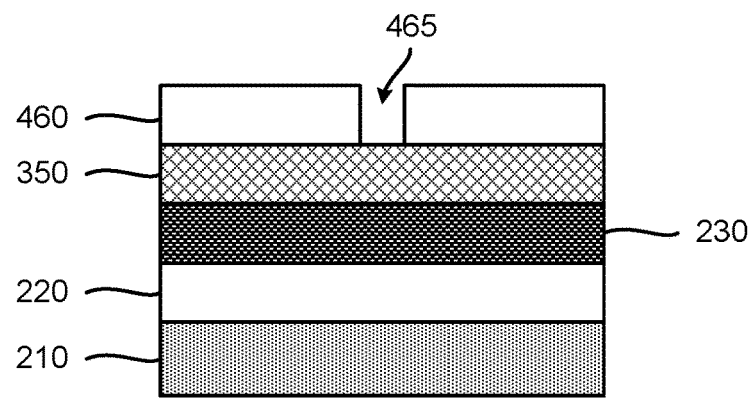
Figure 4B:
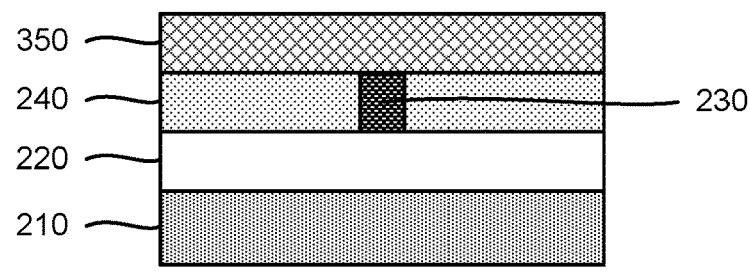
Figure 4C:
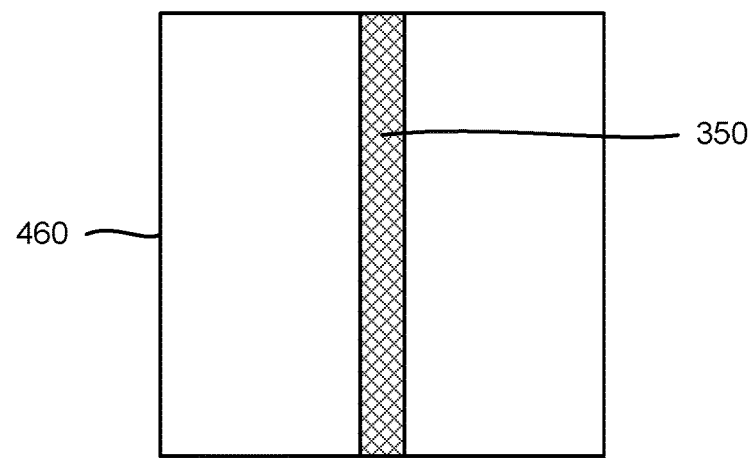

FIGS. 4A, 4B and 4C illustrate a stage in which a first photoresist 460 may be deposited on the first mask 350. The first photoresist 460 may be deposited so as to include an opening 465. The opening 465 may correspond to the isolation cut region (not shown in FIGS. 4A, 4B and 4C), and may expose the first mask 350 in the isolation cut direction.

Figure 5A:
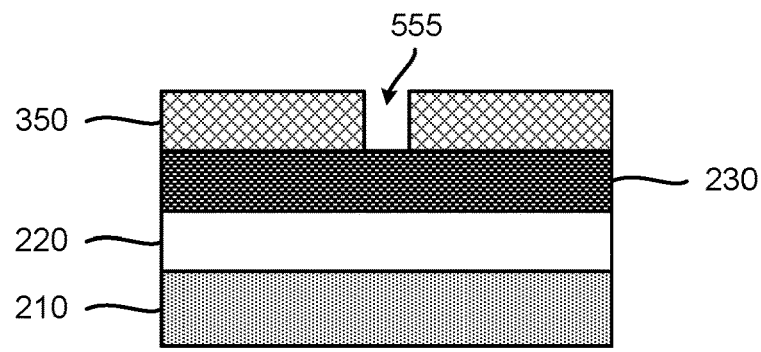
Figure 5B:
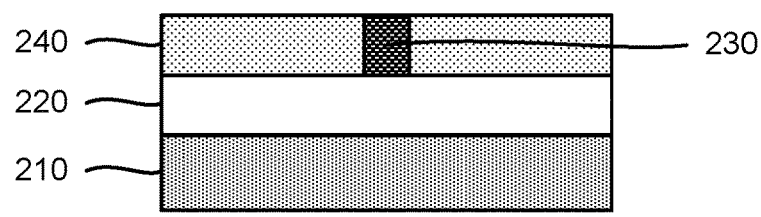
Figure 5C:
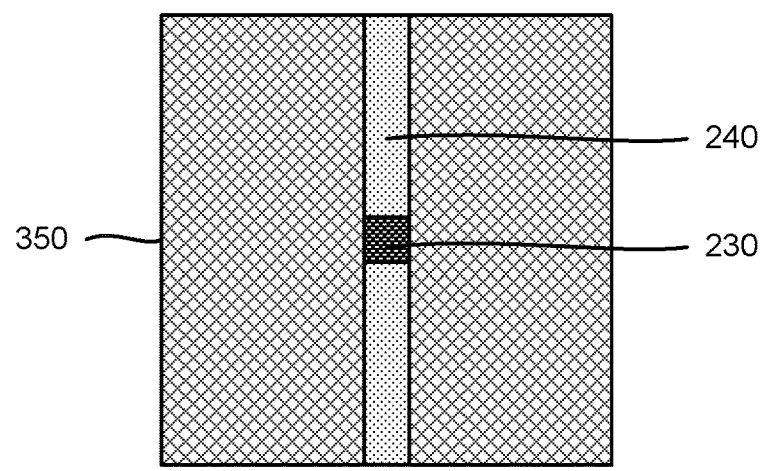

FIGS. 5A, 5B and 5C illustrate a stage in which a trench 555 may be formed in the first mask 350. The trench 555 may be formed by etching the portion of the first mask 350 exposed by the opening 465 of the first photoresist 460 (not shown in FIGS. 5A, 5B and 5C). The etching may continue until the ILD layer 230 is exposed. In this way, the trench 555 may also correspond to the isolation cut region (not shown). Thereafter, the first photoresist 460 may be removed. The trench 555 may expose portions of the first and second gates 240 as well as a portion of the ILD layer 230. The area of the exposed portion of the ILD layer 230 may correspond to the junction between the gate cut and isolation cut masks 115, 125 (not shown), i.e., where the gate cut and isolation cut regions intersect or overlap. Note that the ILD layer 230 may be continuous through the junction.

In an aspect, the ILD layer 230 may remain continuous through the junction during fabrication.

Figure 6A:
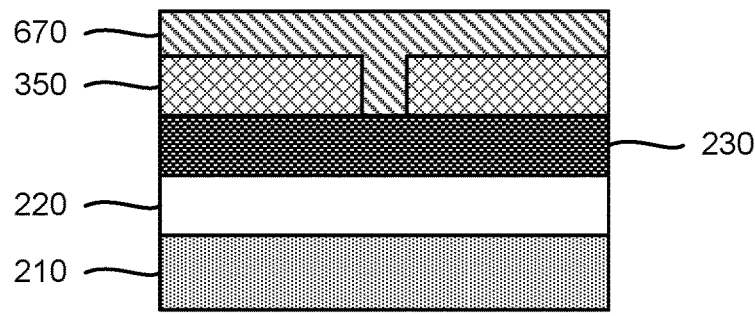
Figure 6B:
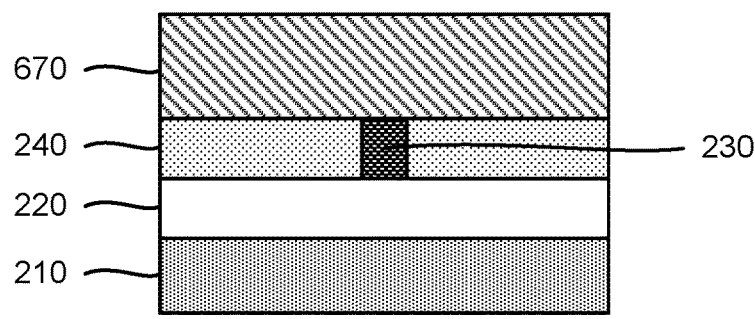
Figure 6C:
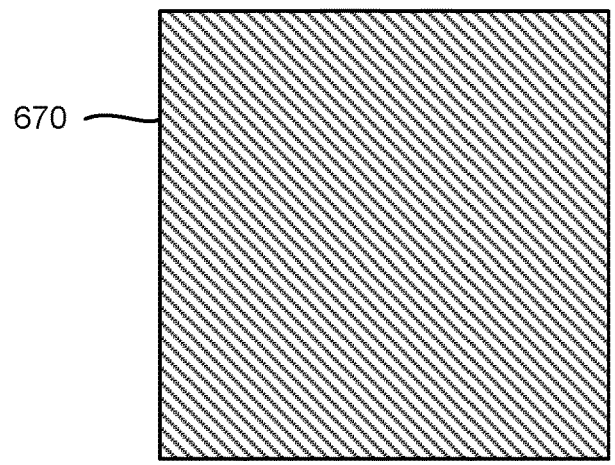

FIGS. 6A, 6B and 6C illustrate a stage in which a second mask 670 may be formed over the first mask 350. The second mask 670 may also be formed on the portion of the ILD layer 230 and on the portions of the first and second dummy gates 240 exposed by the trench 555. The second mask 670 may be a softmask. As an example, softmasks may be formed as spin-on-glass (SOG). The first and second masks 350, 670 may have different etch selectivities and/or different etch rates.

Figure 7A:
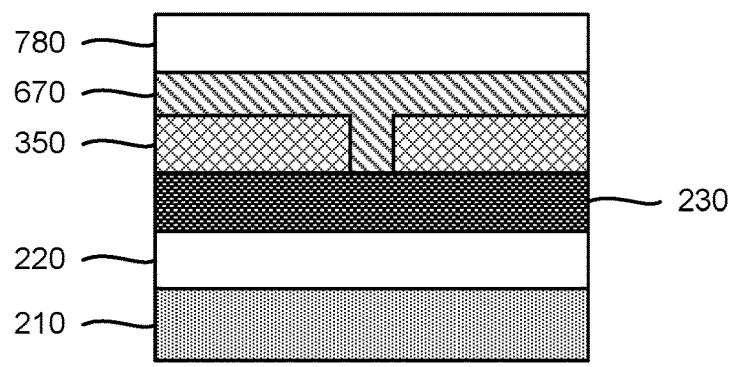
Figure 7B:
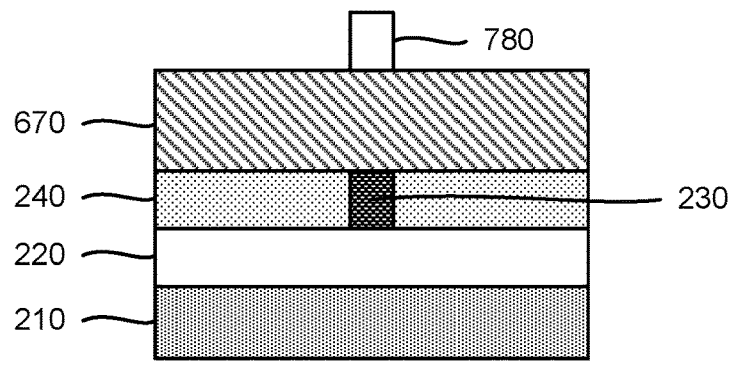
Figure 7C:
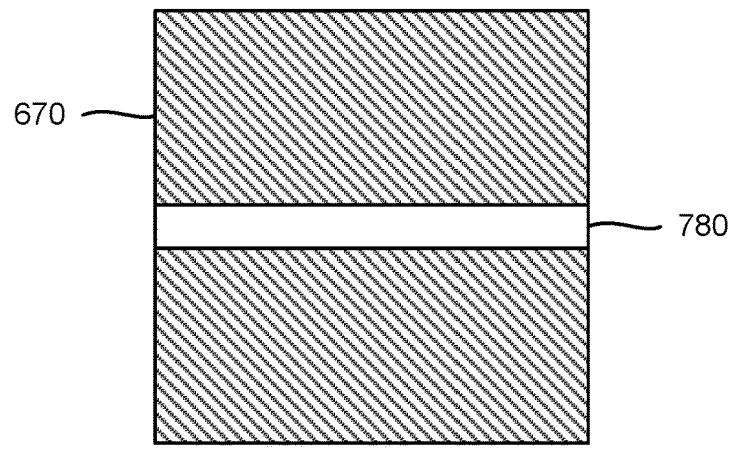

FIGS. 7A, 7B and 7C illustrate a stage in which a second photoresist 780 may be deposited on the second mask 670. The second photoresist 780 may be deposited so as to correspond to the gate cut region (not shown). In an aspect, the gate cut mask 115 (not shown) may be used to deposit the second photoresist 780, but with the tone of the second photoresist 780 being changed from the tone of the first photoresist 460. That is, with the first photoresist 460, the isolation cut region (not shown) corresponds to the opening 465 in which the photoresist material is not deposited. But with the second photoresist 780, the gate cut region corresponds to the area where the photoresist material is deposited. Since the second photoresist 780 may not be formed outside of the gate cut region, the portion of the second mask 670 outside of the gate cut region may be exposed.

Figure 8A:
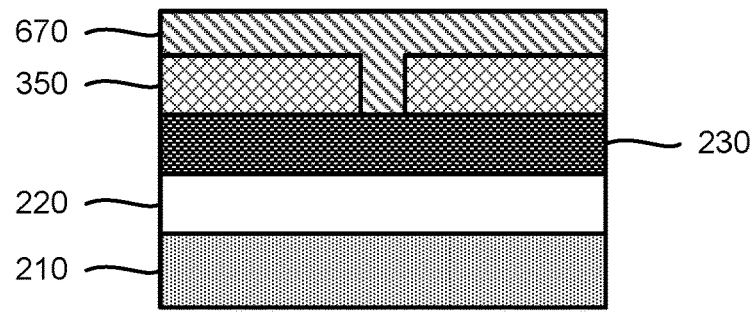
Figure 8B:
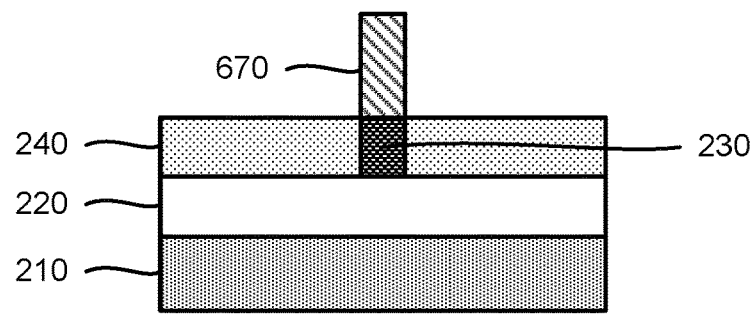
Figure 8C:
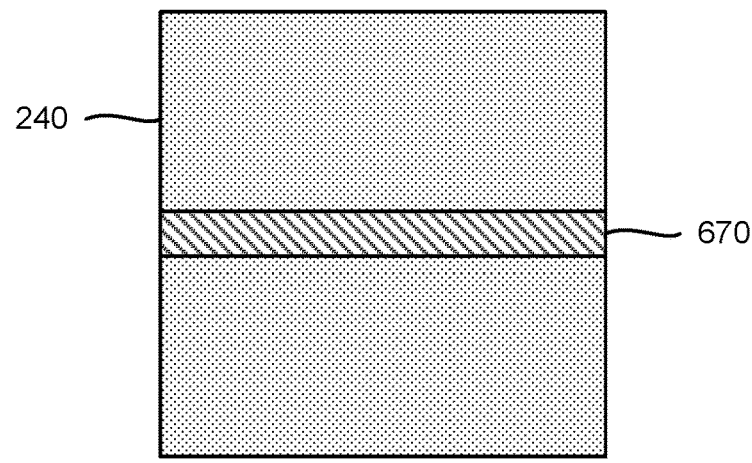

FIGS. 8A, 8B and 8C illustrate a stage in which the exposed portion of the second mask 670 (i.e., outside of the gate cut region) may be etched away. As a result, the dummy gates 240 may be exposed. Note that second mask 670 within the gate cut region may be protected by the second photoresist 780. After etching the exposed portion of the second mask 670, the second photoresist 780 may be cleaned away to expose the remaining second mask 670, which may be a portion of the second mask 670 corresponding to the gate cut region (not shown). The remaining second mask 670 may be viewed as an example of means for masking the ILD layer 230.

Figure 9A:
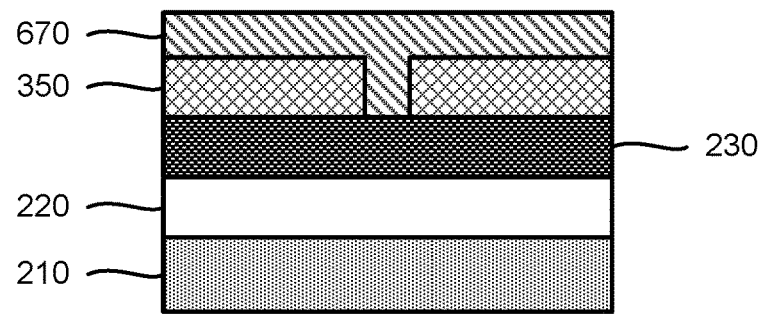
Figure 9B:
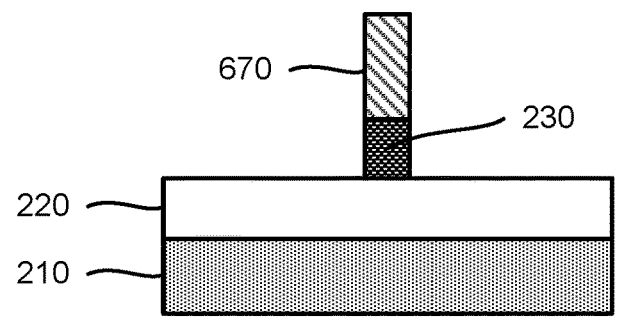
Figure 9C:
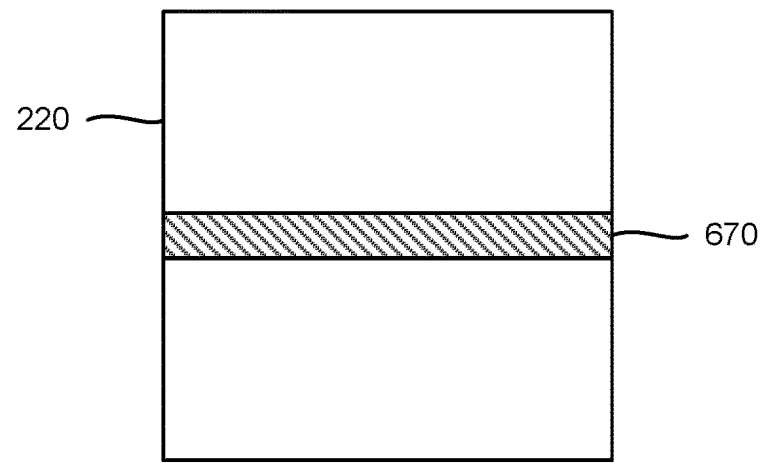

FIGS. 9A, 9B and 9C illustrate a stage in which the first and second dummy gates 240 may be etched, e.g., as part of an etch process. As a result, the STI layer 220 outside of the gate cut region may be exposed. Note that the ILD layer 230 remains intact since it is protected by the second mask 670 in the gate cut region.

Figure 10A:
Figure 10B:
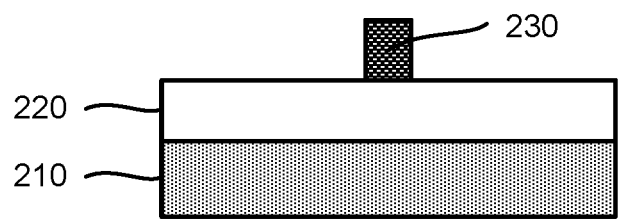
Figure 10C:
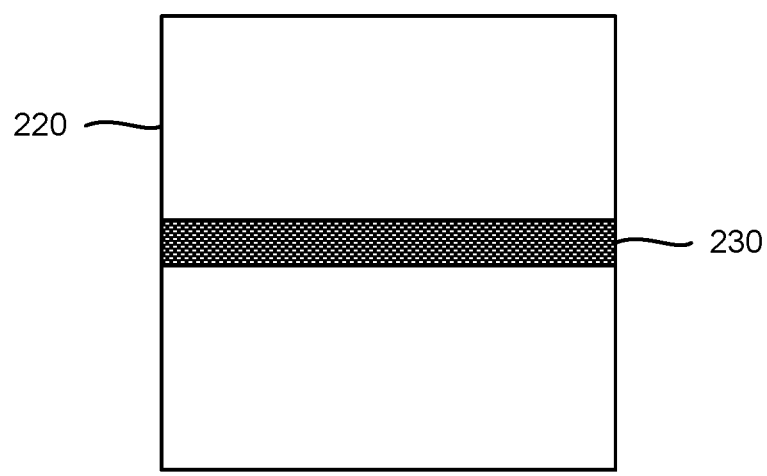

FIGS. 10A, 10B and 10C illustrate a stage in which the remaining first and second masks 350, 670 may be removed. This may be followed by a stage illustrated in FIGS. 11A, 11B and 11C in which the region occupied previously by the dummy gates 240 (i.e., area outside of the gate cut region) with filling 1190 on the STI layer 220. Nitrides of silicon (e.g., SiN) and/or oxides of silicon (e.g., SiO) may be used as materials for the filling 1190. The filling 1190 and/or the ILD layer 230 may be polished, e.g., through chemical-mechanical polishing (CMP). The polishing may stop just above the gate. In an aspect, the filling 1190 and the ILD layer 230 may be coplanar after the polishing.

As seen, the filling 1190 may be on both sides of the ILD layer 230 including on both sides of the ILD layer 230 corresponding to the isolation cut region. Note that the ILD layer 230 may be continuous through the junction where the gate cut and isolation cut regions intersect. In an aspect, the ILD layer 230 may comprise a single layer (e.g., an $SiO_2$ layer) and the filling 1190 may comprise multiple layers (e.g., SiN and SiO layers). In another aspect, the material of the ILD layer 230 may be different from the material(s) of the filling 1190.

Figure 11A:
Figure 11B:
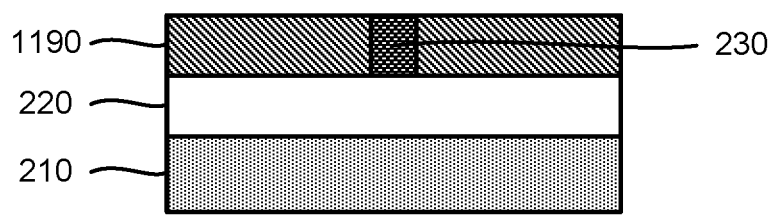
Figure 11C:
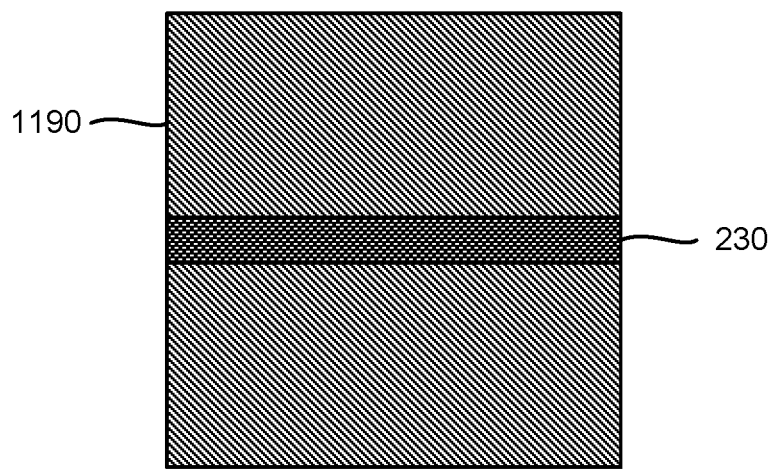

While not shown, conventional replacement metal gate (RMG) process may follow the stage illustrated in FIGS. 11A, 11B and 11C. Since the ILD layer 230 can remain intact during the first example process, the undesirable layout effects can be mitigated or even eliminated.

FIGS. 12A-22A, 12B-22B and 12C-22C illustrate different stages of a second example process to fabricate a semiconductor device such as a FinFET device. Similar to the first example process, the ILD layer may be maintained during the second example process. FIGS. 12A-22A illustrate side views of the semiconductor device fabrication stages along the gate cut region, FIGS. 12B-22B illustrate side views of the semiconductor device fabrication stages along the isolation cut region, and FIGS. 12C-22C illustrate top views of the semiconductor device fabrication stages. Again, while not explicitly shown in these figures, the gate and isolation cut regions and directions may be assumed to be similar to FIGS. 2A-11A, 2B-11B and 2C-11C.

Figure 12A:
Figure 12B:
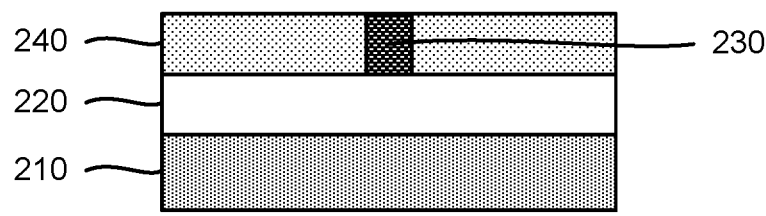
Figure 12C:
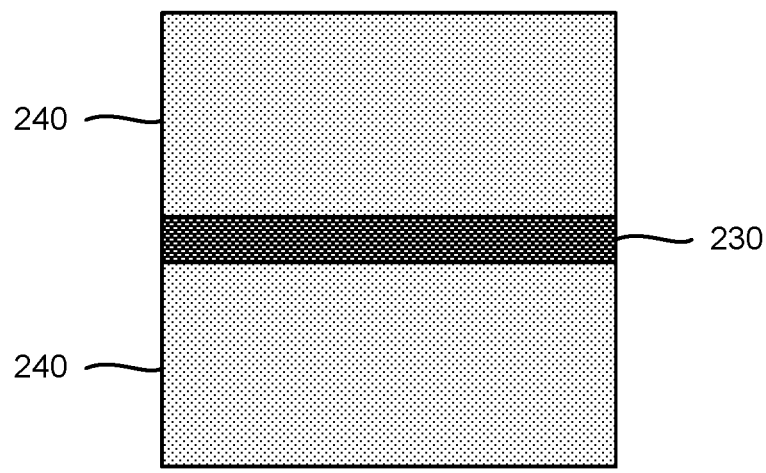

FIGS. 12A, 12B and 12C illustrate a fabrication stage in which a substrate 210 (e.g., Si substrate) may be formed, an STI layer 220 (e.g., SiN, SiO) may be formed on the substrate 210, and an ILD layer 230 (e.g., an oxide layer) and dummy gates 240 may be formed on the STI layer 220. The ILD layer 230 may be formed corresponding to the gate cut region (not shown). As seen, the ILD layer 230 may separate the dummy gates 240 formed on either side of the ILD layer 230. The two dummy gates 240 may also be referred to as first and second dummy gates 240. This stage may be similar or identical to the stage of the first example process illustrated in FIGS. 2A, 2B and 2C.

Figure 13A:
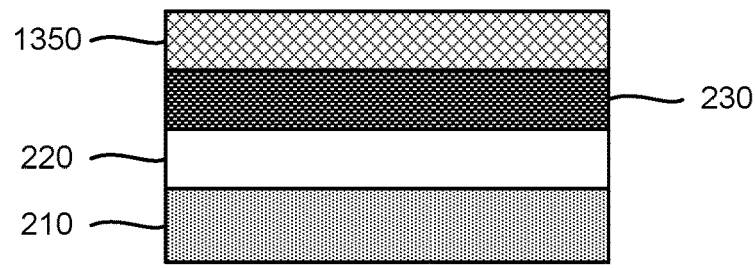
Figure 13B:
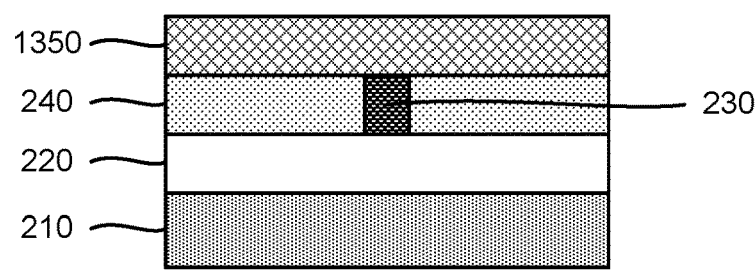
Figure 13C:
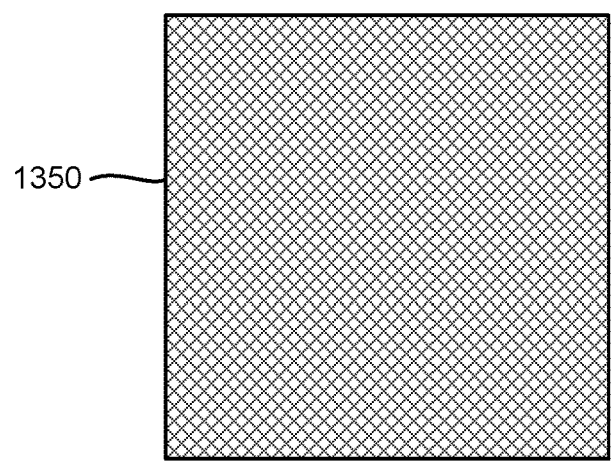

FIGS. 13A, 13B and 13C illustrate a stage in which a first mask 1350 may be formed on the ILD layer 230 and on the first and second dummy gates 240. The first mask 1350 may be a hardmask formed from materials such as nitrides of silicon (e.g., SiN). The first mask 1350 may also be referred to as a first hardmask. This stage may be similar or identical to the stage of the first example process illustrated in FIGS. 3A, 3B and 3C.

Figure 14A:
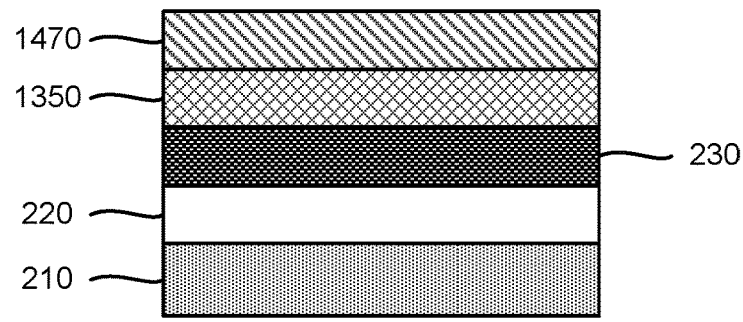
Figure 14B:
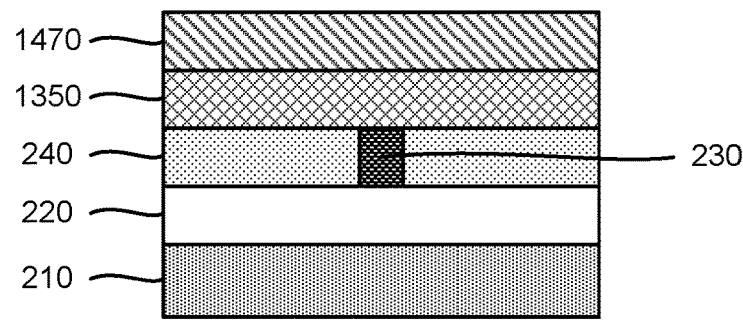
Figure 14C:
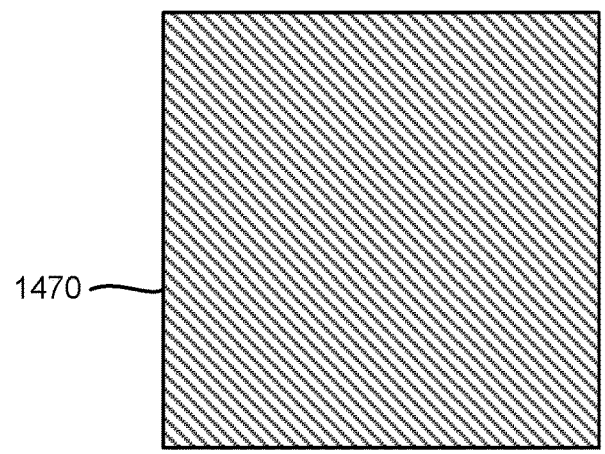

FIGS. 14A, 14B and 14C illustrate a stage in which a second mask 1470 may be deposited on the first mask 1350. The second mask 1470 may also be a hardmask and may be formed from materials such as oxides of silicon (e.g., SiO$_2$). The second mask 1470 may also be referred to as a second hardmask. The first and second masks 1350, 1470 may have different etch selectivities.

Figure 15A:
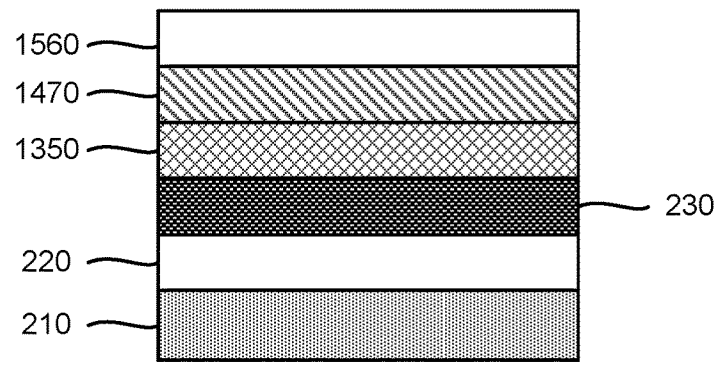
Figure 15B:
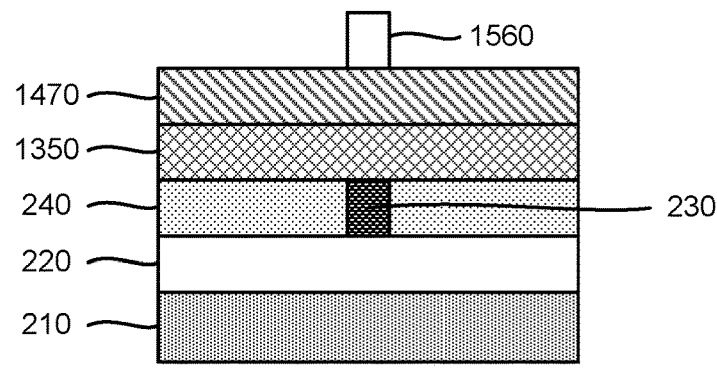
Figure 15C:
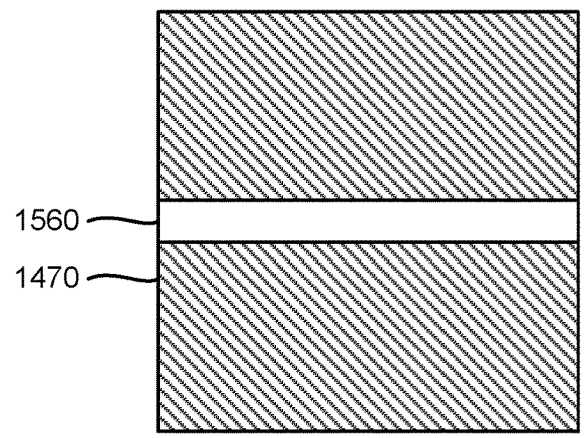

FIGS. 15A, 15B and 15C illustrate a stage in which a first photoresist 1560 may be deposited on the second mask 1470. The first photoresist 1560 may be patterned according to the gate cut mask 115 (not shown) but with the tone changed such that the patterned first photoresist 1560 corresponds to the gate cut region (not shown). After the first photoresist 1560 is formed, the portion of the second mask 1470 outside of the gate cut region may be exposed.

Figure 16A:
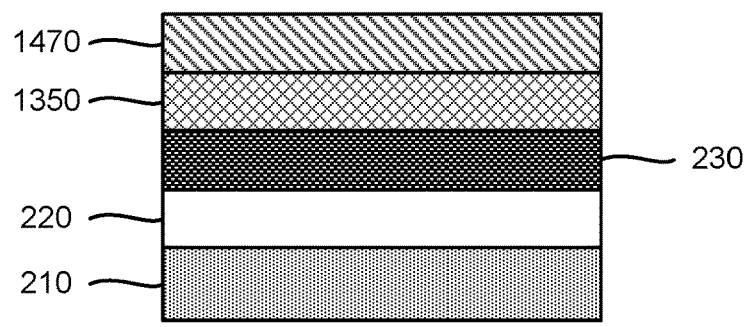
Figure 16B:
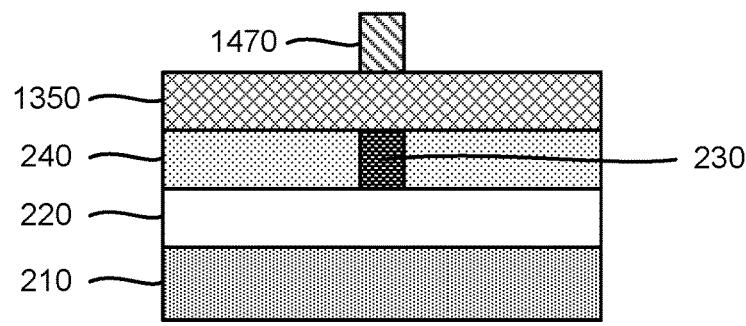
Figure 16C:
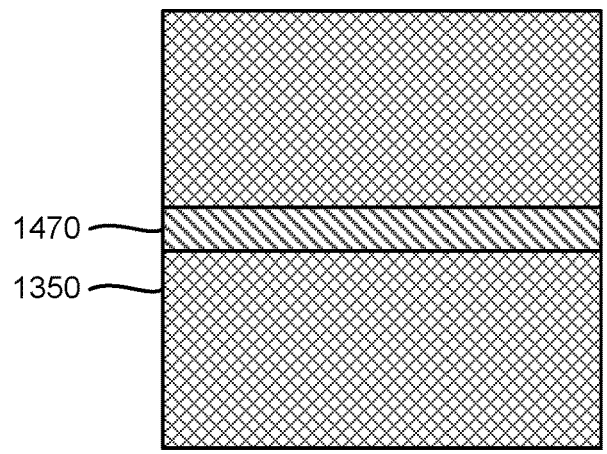

FIGS. 16A, 16B and 16C illustrate a stage in which the exposed portion of the second mask 1470 (i.e., outside of the gate cut region) may be removed, e.g., through etching. The second mask 1470 within the gate cut region may be protected by the first photoresist 1560. As a result, the first mask 1350 outside of the gate cut region may be exposed. After the removal of the exposed portion of the second mask 1470, the first photoresist 1560 may be cleaned away to expose the remaining second mask 1470, which may be a portion of the second mask corresponding to the gate cut region (not shown).

Figure 17A:
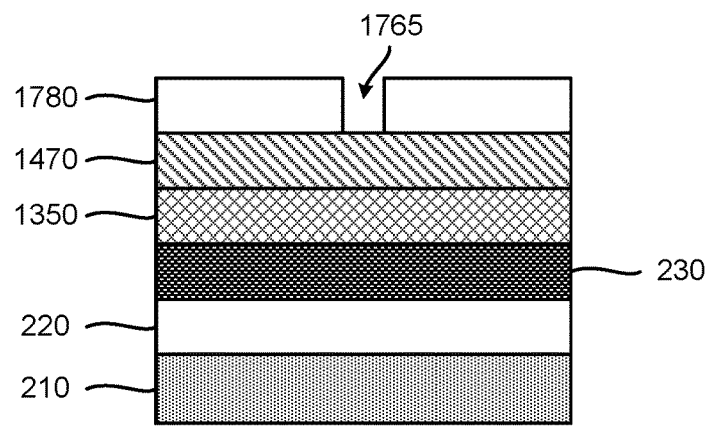
Figure 17B:
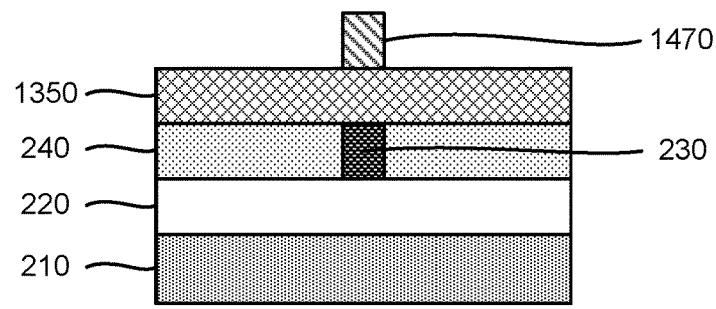
Figure 17C:
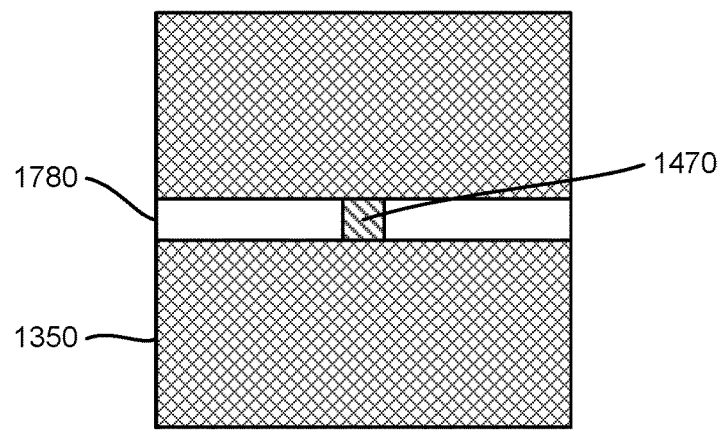

FIGS. 17A, 17B and 17C illustrate a stage in which a second photoresist 1780 may be deposited on the second mask 1470 so as to correspond to the gate cut region (not shown). In this way, the first mask 1350 outside of the gate cut region may remain exposed. The second photoresist 1780 may be deposited so as to include an opening 1765, e.g., by using the isolation cut mask 125 (not shown). As seen in FIG. 17C, the opening 1765 may expose a part of the second mask 1470 that is within both the gate cut and the isolation cut regions, i.e., where the two regions intersect.

Figure 18A:
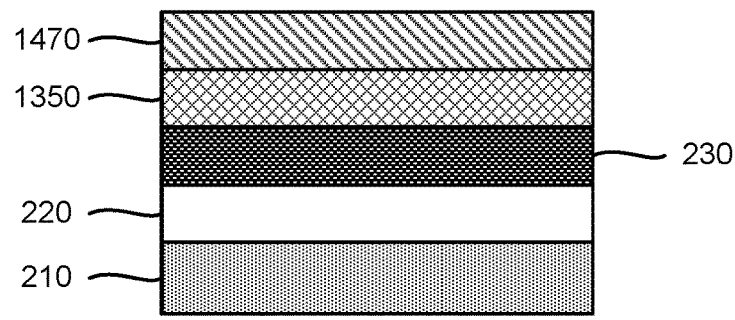
Figure 18B:
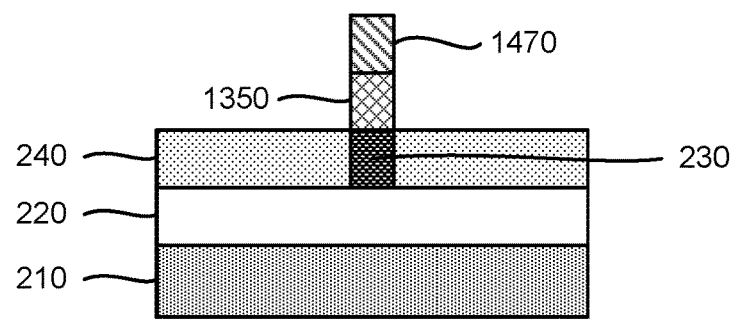
Figure 18C:
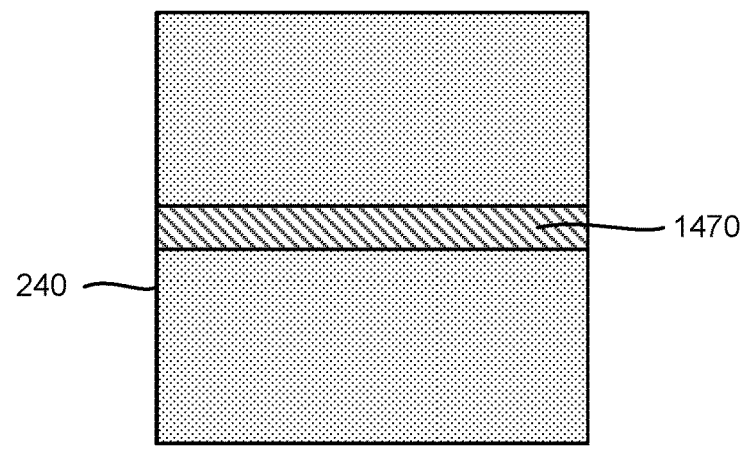

FIGS. 18A, 18B and 18C illustrate a stage in which a selective etching may be performed to remove the exposed first mask 1350 outside of the gate cut region (not shown). Due to the selective etching of the first mask 1350 over the second mask 1470, the portion of the first mask 1350 below the remaining second mask 1470, i.e., the remaining first mask 1350, may be protected from being etched. After the selective etching, the second photo resist 1780 may be cleaned away exposing the remaining second mask 1470, which may correspond to the gate cut region. The remaining mask 1470 may be viewed as an example of means for masking the ILD layer 230. Alternatively, the remaining first and second masks 1350, 1470 may be viewed respectively as examples of first and second means for masking the ILD layer 230.

Figure 19A:
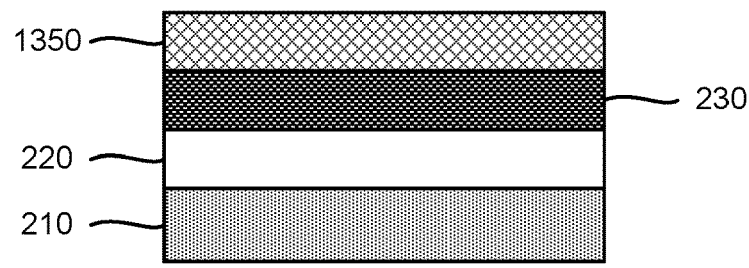
Figure 19B:
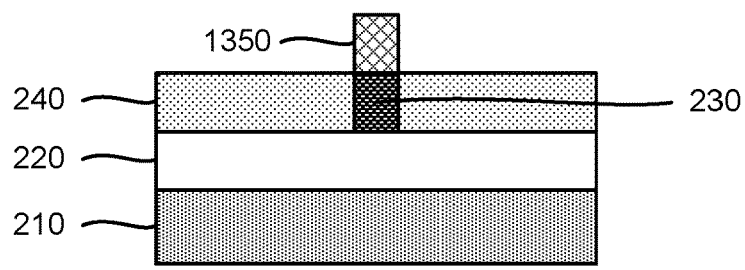
Figure 19C:
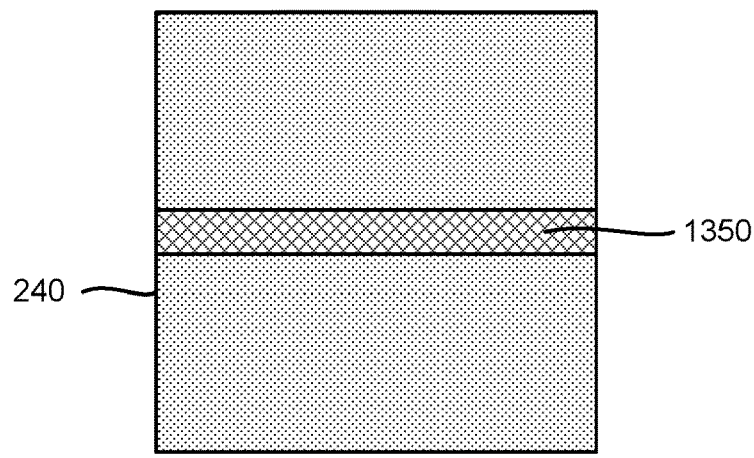

FIGS. 19A, 19B and 19C illustrate a stage in which the remaining second mask 1470 may be removed so as to expose the remaining first mask 1350 within the gate cut region (not shown). That is, the exposed first mask 350 may correspond to the gate cut region.

Figure 20A:
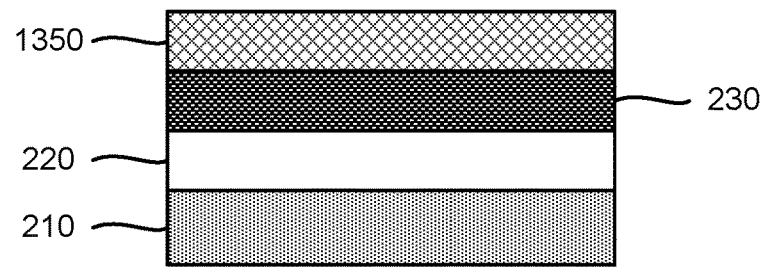
Figure 20B:
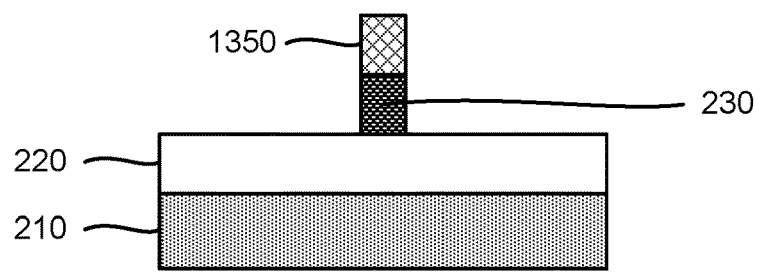
Figure 20C:
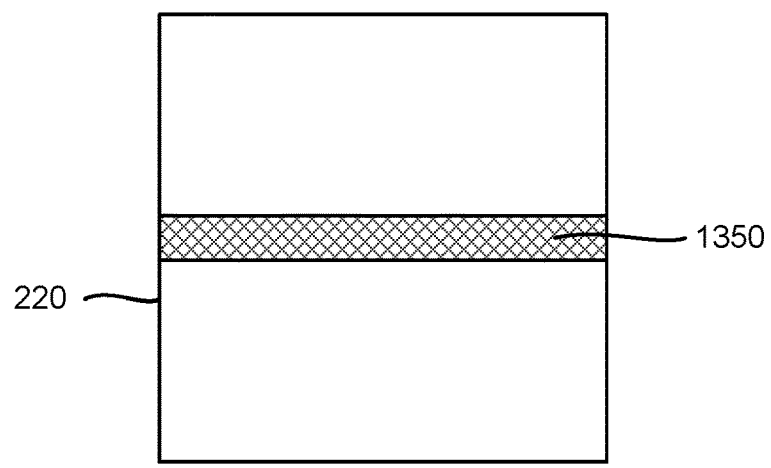

FIGS. 20A, 20B and 20C illustrate a stage in which the first and second dummy gates 240 may be removed, e.g., as part of an etch process. As a result, the STI layer 220 outside of the gate cut region may be exposed. Note that the ILD layer 230 remains intact since it is protected by the first mask 1350 in the gate cut region.

Figure 21A:
Figure 21B:
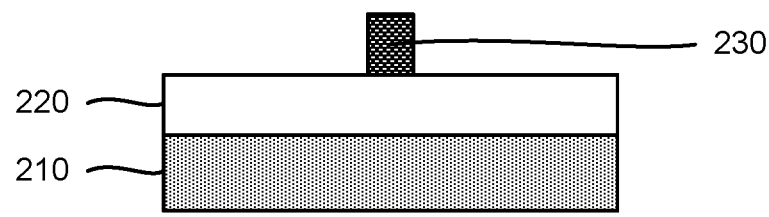
Figure 21C:
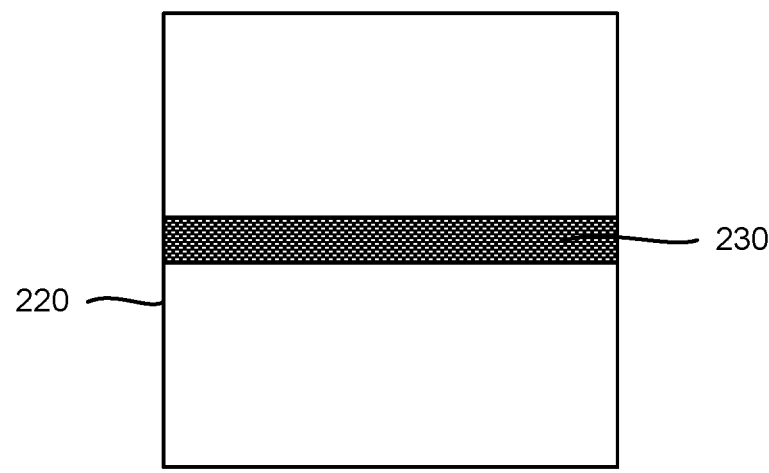

FIGS. 21A, 21B and 21C illustrate a stage in which the remaining first mask 1350 may be removed. The result of this stage may be similar or identical to the result of the stage of the first example process illustrated in FIGS. 10A, 10B and 10C. This may be followed by a stage illustrated in FIGS. 22A, 22B and 22C in which the region occupied previously by the dummy gates 240—the region outside of the gate cut region—with filling 2290. For example, silicon nitride and/or silicon oxide may be used as materials for the filling 2290. The filling 2290 and/or the ILD layer 230 may be polished, e.g., through chemical-mechanical polishing (CMP). The polishing may stop just above the gate. The result of this stage may be similar or identical to the result of the stage of the first example process illustrated in FIGS. 11A, 11B and 11C. For example, in an aspect, the filling 2290 and the ILD layer 230 may be coplanar after the polishing.

The filling 2290 may be on both sides of the ILD layer 230 including on both sides of the ILD layer 230 corresponding to the isolation cut region. The ILD layer 230 may be continuous through the junction where the gate cut and isolation cut regions intersect. In an aspect, the ILD layer 230 may comprise a single layer (e.g., an SiO$_2$ layer) and the filling 2290 may comprise multiple layers (e.g., SiN and SiO layers). In another aspect, the material of the ILD layer 230 may be different from the material(s) of the filling 2290.

Figure 22A:
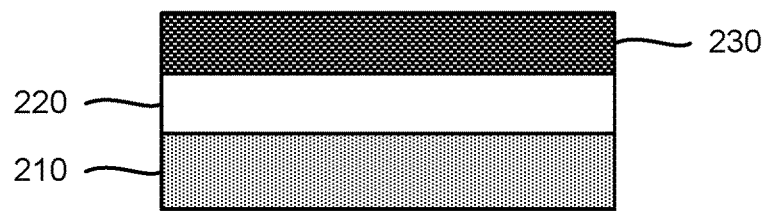
Figure 22B:
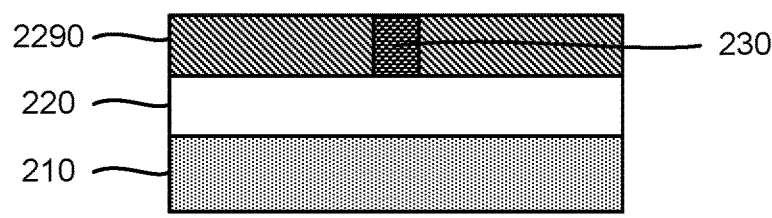
Figure 22C:
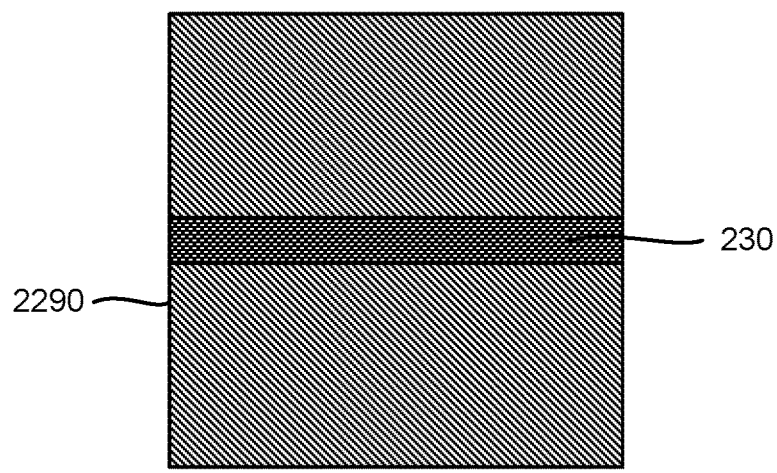

While not shown, conventional replacement metal gate (RMG) process may follow the stage illustrated in FIGS. 22A, 22B and 22C. Since the ILD layer 230 can remain intact during the second example process, the undesirable layout effects can be mitigated or even eliminated.

Figure 23:
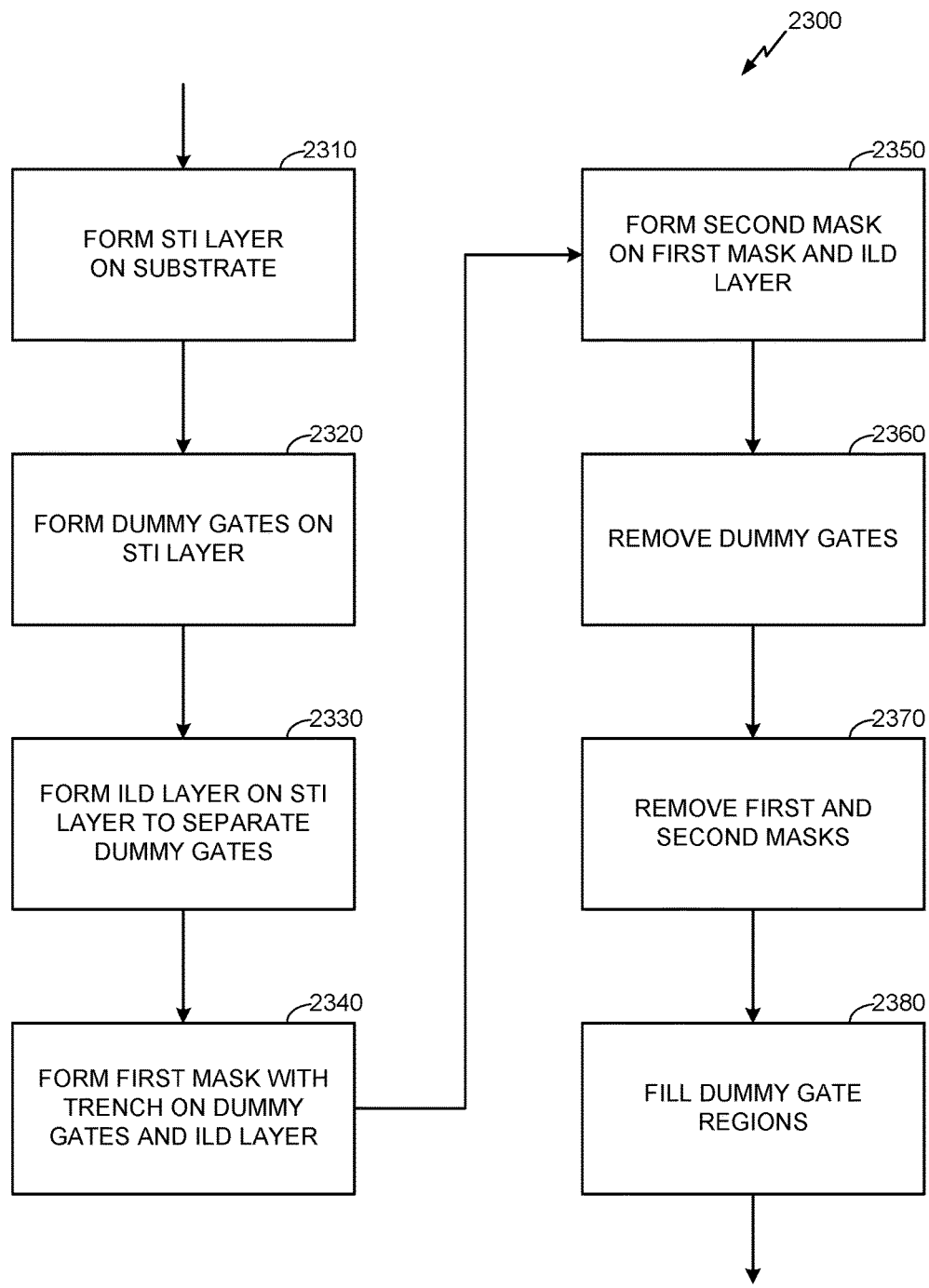
FIG. 23 illustrates a flow chart of an example method of forming a semiconductor device.

FIG. 23 illustrates a flow chart of an example method 2300 of forming a semiconductor device such as a FinFET. The example method 2300 may be applicable to the first example process illustrated in FIGS. 2A-11A, 2B-11B and 2C-11C. It should be noted that not all illustrated blocks of FIG. 23 need to be performed, i.e., some blocks may be optional. Also, the numerical references to the blocks of the FIG. 23 should not be taken as requiring that the blocks should be performed in a certain order.

In block 2310, the STI layer 220 may be formed on the substrate 210. In block 2320, the first and dummy gates 240 may be formed on the STI layer 220. In block 2330, the ILD layer 230 may also be formed on the STI layer. The blocks 2310, 2320 and 2330 may correspond to the stage illustrated in FIGS. 2A, 2B and 2C. For example, the ILD layer 230 may correspond to the gate cut region and separate the first and second dummy gates 240. Recall that the gate cut region may be a region or an area of the gate cut mask 115.

In block 2340, the first mask 350 may be formed on the first and second dummy gates 240 and on the ILD layer 230. The trench 555 corresponding to the isolation cut region may be formed in the first mask 350. Recall that the isolation cut region may be a region or an area of the isolation cut mask 125. As noted, the gate cut and isolation cut regions may intersect. In an aspect, the two regions may be substantially perpendicular.

Figure 24:
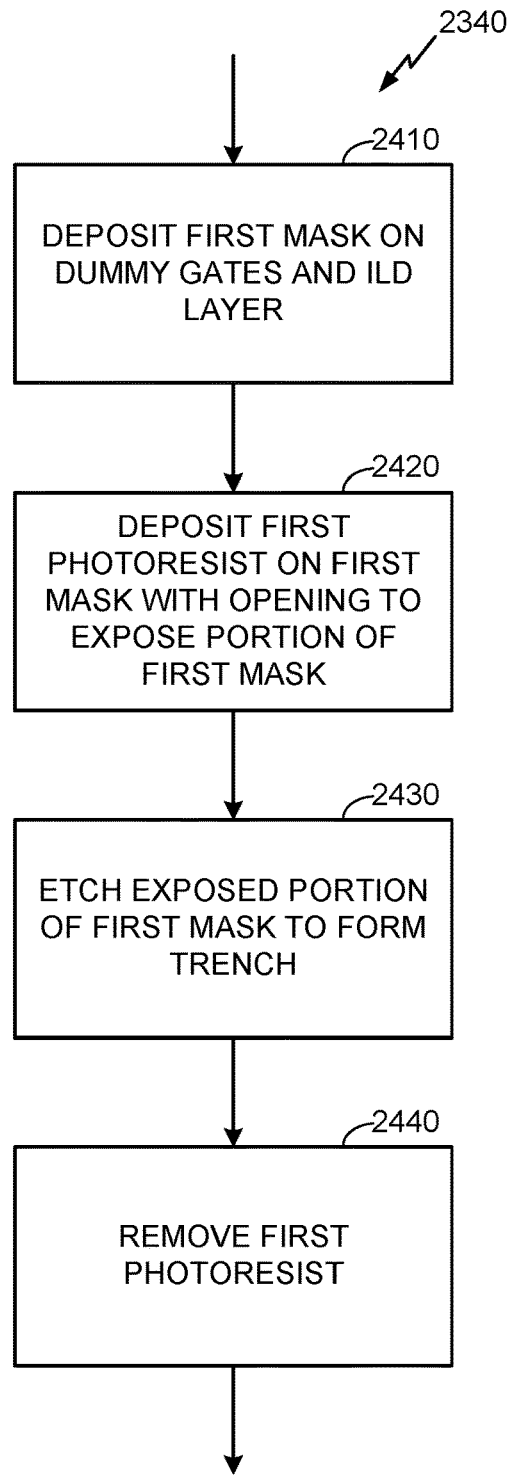
FIG. 24 illustrates a flow chart of an example process of forming a first mask in the example method forming a semiconductor device.

FIG. 24 illustrates a flow chart of an example process to perform the block 2340. In block 2410, the first mask 350 may be deposited on the first and second dummy gates 240 and on the ILD layer 230. The first mask 350 may be a hardmask. The block 2410 may correspond to the stage illustrated in FIGS. 3A, 3B and 3C.

In block 2420, the first photoresist 460 may be deposited on the first mask 350. The first photoresist 460 may be patterned to have an opening 465 that corresponds to the isolation cut region. The opening 465 may expose a portion of the first mask 350. The block 2420 may correspond to the stage illustrated in FIGS. 4A, 4B and 4C.

In block 2430, the exposed portion of the first mask 350 may be etched to form the trench 555. The portion of the first mask 350 outside the isolation cut region, i.e., the portion of the first mask 350 covered by the first photoresist 460 may be protected from being etched. Then in block 2440, the first photoresist 460 may be removed. The blocks 2430 and 2440 may correspond to the stage illustrated in FIGS. 5A, 5B and 5C.

Referring back to FIG. 23, in block 2350, the second mask 670 may be formed on the first mask 350. The second mask 670 may also be formed on the ILD layer 230 exposed by the trench 555. The second mask 650 may be a softmask. The second mask 670 may have different etching rate and/or selectivity from the first mask 350. The block 2350 may correspond to the stage illustrated in FIGS. 6A, 6B and 6C.

Figure 25:
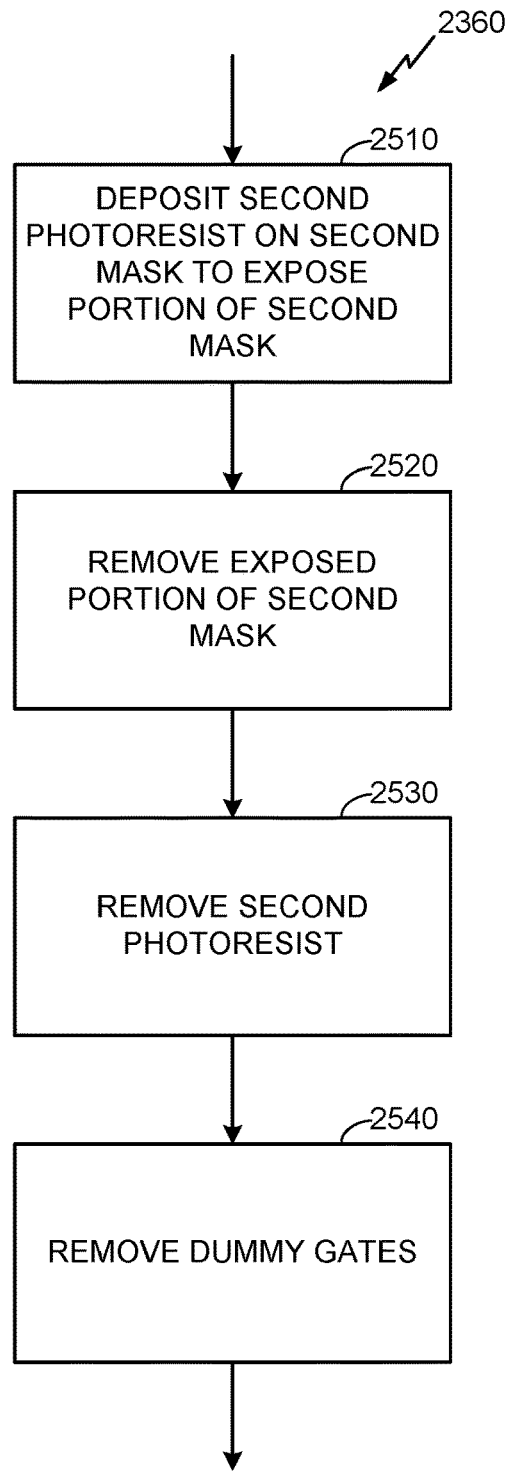
FIG. 25 illustrates a flow chart of an example process of removing dummy gates in the example method forming a semiconductor device.

In block 2360, the first and second dummy gates 240 may be removed. FIG. 25 illustrates a flow chart of an example process to perform the block 2360. In block 2510, the second photoresist 780 may be deposited on the second mask 670 and patterned to correspond to the gate cut region such that a portion of the second mask 670 outside of the gate cut region is exposed. The block 2510 may correspond to the stage illustrated in FIGS. 7A, 7B and 7C.

In block 2520, the exposed portion of the second mask 670 may be removed, e.g., through etching. The first and second dummy gates 240, which are outside of the gate cut region, may be exposed after the second mask 670 is removed. In block 2530, the second photoresist 670 may be removed. The remaining second mask 670, i.e., the portion that corresponds to the gate cut region, may protect the ILD layer 230. The blocks 2520 and 2530 may correspond to the stage illustrated in FIGS. 8A, 8B and 8C.

In block 2540, the first and second dummy gates 240 may be removed. For example, etching may be performed which pulls out the dummy gates 240. The gate cut region may be protected by the remaining second mask 670. Thus, the ILD layer 230 may remain intact through the etching process. The block 2540 may correspond to the stage illustrated in FIGS. 9A, 9B and 9C.

Referring back to FIG. 23, in block 2370, the first and second masks 350, 670 may be removed, e.g., through etching. Note that the ILD layer 230 may still remain. The block 2370 may correspond to the stage illustrated in FIGS. 10A, 10B and 10C.

In block 2380, the regions left by the removed dummy gates 240 may be filled with filling 1190. That is, the filling 1190 may be filled in the area outside of the gate cut region. Materials including SiN and SiO may be used for the filling 1190. The filling 1190 and/or the ILD layer 230 may be polished, e.g., through chemical-mechanical polishing (CMP). The polishing may stop just above the gate. The block 2380 may correspond to the stage illustrated in FIGS. 11A, 11B and 11C.

While not shown, conventional replacement metal gate (RMG) process may follow the method illustrated in FIG. 23. Since the ILD layer 230 can remain intact by the method 2300, undesirable layout effects may be mitigated or even eliminated.

Figure 26:
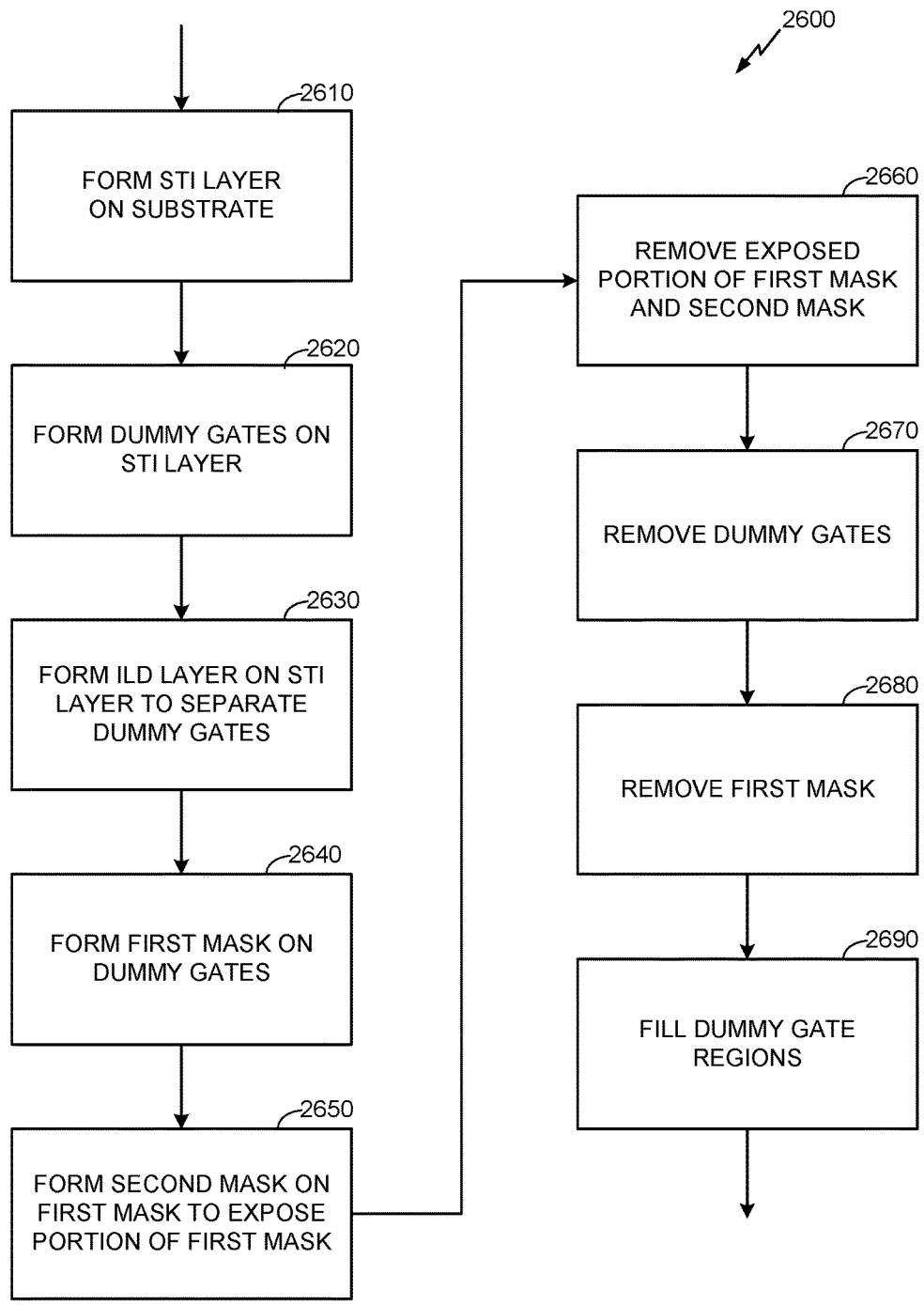
FIG. 26 illustrates a flow chart of another example method of forming a semiconductor device.

FIG. 26 illustrates a flow chart of another example method 2600 of forming a semiconductor device such as a FinFET. The example method 2600 may be applicable to the second example process illustrated in FIGS. 12A-22A, 12B-22B and 12C-22C. It should be noted that not all illustrated blocks of FIG. 26 need to be performed, i.e., some blocks may be optional. Also, the numerical references to the blocks of the FIG. 26 should not be taken as requiring that the blocks should be performed in a certain order.

In block 2610, the STI layer 220 may be formed on the substrate 210. In block 2620, the first and dummy gates 240 may be formed on the STI layer 220. In block 2630, the ILD layer 230 may also be formed on the STI layer. The blocks 2610, 2620 and 2630 may correspond to the stage illustrated in FIGS. 12A, 12B and 12C. For example, the ILD layer 230 may correspond to the gate cut region and separate the first and second dummy gates 240.

In block 2640, the first mask 350 may be formed on the first and second dummy gates 240 and on the ILD layer 230. The first mask 350 may be a hardmask formed from materials such as SiN and/or SiO2. The block 2640 may correspond to the stage illustrated in FIGS. 13A, 13B and 13C.

Figure 27:
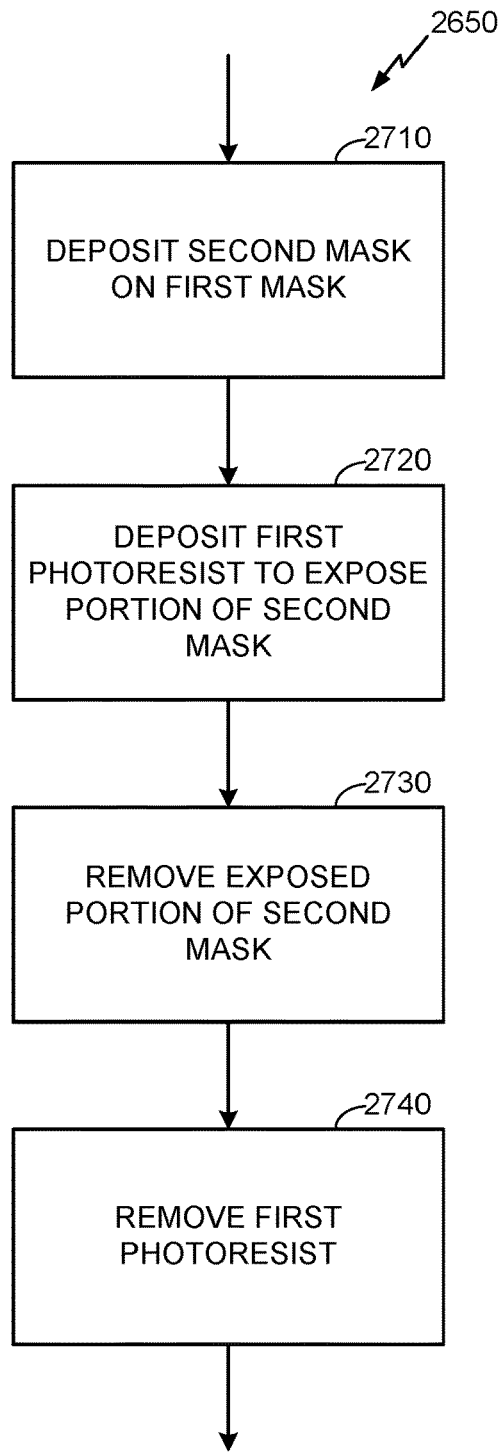
FIG. 27 illustrates a flow chart of an example process of forming a second mask on a first mask in the another example method forming a semiconductor device.

In block 2650, the second mask 1470 may be formed on the first mask 1350. The second mask 1470 may correspond to the gate cut region such that a portion of the first mask 1350 outside of the gate cut region is exposed. FIG. 27 illustrates a flow chart of an example process to perform the block 2650. In block 2710, the second mask 1470 may be deposited on the first mask 1350. The second mask 1470 may also be a hardmask formed from materials such as SiN and/or SiO2. The second mask 1470 may be formed from materials different from the first mask 1350. The block 2710 may correspond to the stage illustrated in FIGS. 14A, 14B and 14C.

In block 2720, the first photoresist 1560 may be deposited on the second mask 1470. The first photoresist 1560 may be patterned to correspond to the gate cut region, e.g., in accordance with the gate cut mask 115. The portion of the second mask 1470 outside the gate cut region may be exposed after the first photoresist 1560 is formed. The block 2720 may correspond to the stage illustrated in FIGS. 15A, 15B and 15C.

In block 2730, the exposed portion of the second mask 1470 may be removed. In this way, the portion of the first mask 1350 outside of the gate cut region may be exposed. Thereafter in block 2740, the first photoresist 1560 may be removed. The blocks 2730 and 2740 may correspond to the stage illustrated in FIGS. 16A, 16B and 16C.

Figure 28:
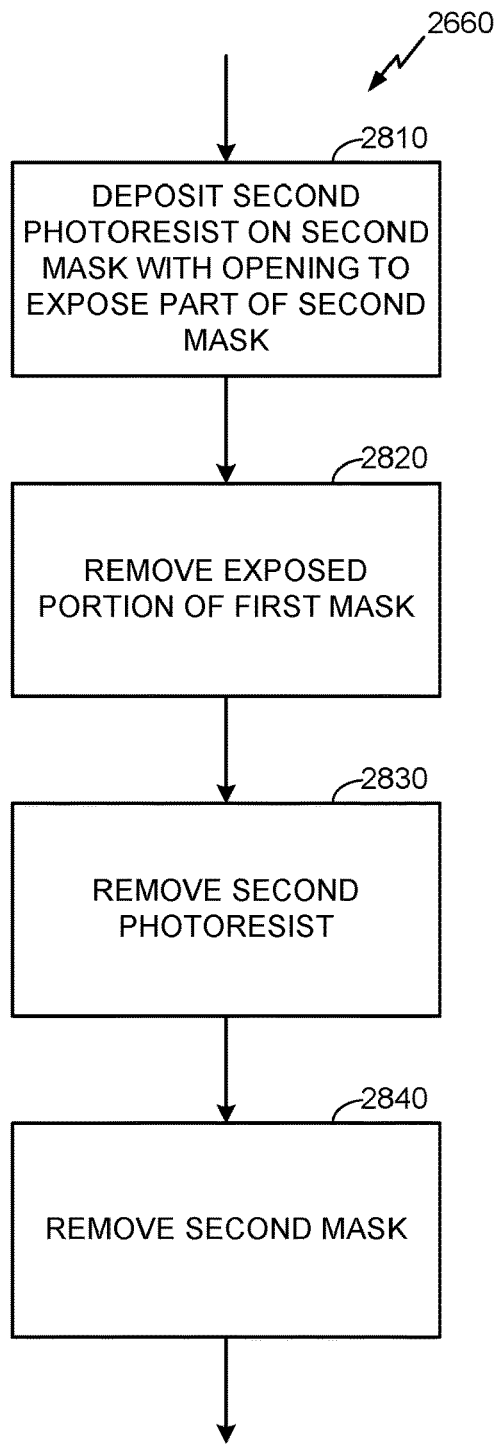
FIG. 28 illustrates a flow chart of an example process of removing an exposed portion of a first mask and a second mask in the another example method forming a semiconductor device.

Referring back to FIG. 26, in block 2660, the exposed portion of the first mask 1350 and the second mask 1470 may be removed. In doing so, the portion of the first mask 1350 corresponding to the gate cut region may remain on the ILD layer 230. FIG. 28 illustrates a flow chart of an example process of performing the block 2660. In block 2810, the second photoresist 1780 corresponding to the gate cut region may be deposited on the second mask 1470. The second photoresist 1780 may have an opening 1765 that exposes a part of the second mask 1470. The opening 1765 may correspond to an intersection between the gate cut and isolation cut regions. The block 2810 may correspond to the stage illustrated in FIGS. 17A, 17B and 17C. Note that the first mask 1350 outside the gate cut region may remain exposed.

In block 2820, the exposed portion of the first mask 1350 may be selectively removed, e.g., through selective etching. When the selective etching is performed, the portion of the first mask 1350 corresponding to the gate cut region below the second mask 1470 may remain since it may be protected by the second mask 1470. This means that the ILD layer 230 below the first mask 1350 may also remain. In block 2830, the exposed second photoresist 1780 may be removed. The blocks 2820 and 2830 may correspond to the stage illustrated in FIGS. 18A, 18B and 18C.

In block 2840, the second mask 1470 may be removed. In doing so, the first mask 1350 corresponding to the gate cut region may be exposed. The block 2840 may correspond to the stage illustrated in FIGS. 19A, 19B and 19C.

Referring back to FIG. 26, in block 2670, the first and second dummy gates 240 may be removed. For example, etching may be performed which pulls out the dummy gates 240. The gate cut region may be protected by the remaining first mask 1350. Thus, the ILD layer 230 may remain intact through the etching process. The block 2670 may correspond to the stage illustrated in FIGS. 20A, 20B and 20C.

In block 2680, the first mask 1350 may be removed, e.g., through etching. Note that the ILD layer 230 may still remain. The block 2680 may correspond to the stage illustrated in FIGS. 21A, 21B and 21C.

In block 2690, the regions left by the removed dummy gates 240 may be filled with filling 2290. That is, the filling 2290 may be filled in the area outside of the gate cut region. Materials including SiN and SiO may be used for the filling 2290. The filling 2290 and/or the ILD layer 230 may be polished, e.g., through chemical-mechanical polishing (CMP). The polishing may stop just above the gate. The block 2690 may correspond to the stage illustrated in FIGS. 22A, 22B and 22C.

While not shown, conventional replacement metal gate (RMG) process may follow the method illustrated in FIG. 26. Since the ILD layer 230 can remain intact by the method 2600, undesirable layout effects may be mitigated or even eliminated.

Figure 29:
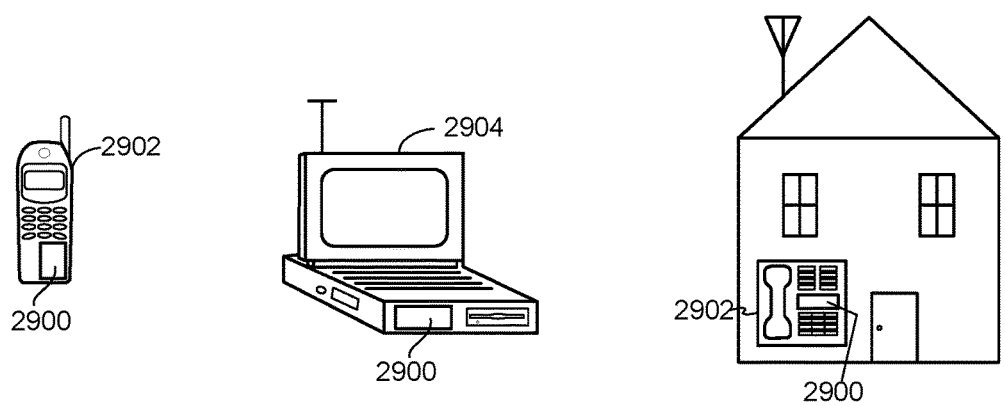
FIG. 29 illustrates examples of devices with a semiconductor device integrated therein.

FIG. 29 illustrates various electronic devices that may be integrated with any of the aforementioned semiconductor device. For example, a mobile phone device 2902, a laptop computer device 2904, and a fixed location terminal device 2906 may include a semiconductor device 2900 as described herein. The semiconductor device 2900 may be, for example, any of the integrated circuits, dies, integrated devices, integrated device packages, integrated circuit devices, device packages, integrated circuit (IC) packages, package-on-package devices described herein. The devices 2902, 2904, 2906 illustrated in FIG. 29 are merely exemplary. Other electronic devices may also feature the semiconductor device including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithms described in connection with the examples disclosed herein may be implemented as electronic hardware, computer software, or combinations of both. To clearly illustrate this interchangeability of hardware and software, various illustrative components, blocks, modules, circuits, and methods have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The methods, sequences and/or algorithms described in connection with the examples disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an aspect can include a computer readable media embodying a method of forming a semiconductor device. Accordingly, the scope of the disclosed subject matter is not limited to illustrated examples and any means for performing the functionality described herein are included.

While the foregoing disclosure shows illustrative examples, it should be noted that various changes and modifications could be made herein without departing from the scope of the disclosed subject matter as defined by the appended claims. The functions, processes and/or actions of the method claims in accordance with the examples described herein need not be performed in any particular order. Furthermore, although elements of the disclosed subject matter may be described or claimed in the singular, the plural is contemplated unless limitation to the singular is explicitly stated.

What is claimed is:

1. A method for forming a semiconductor device, the method comprising:
   forming a shallow trench isolation (STI) layer on a substrate;
   forming first and second dummy gates on the STI layer;
   forming an interlayer dielectric (ILD) layer on the STI layer, the ILD layer corresponding to a gate cut region and separating the first and second dummy gates;
   forming a first mask on the first and second dummy gates and on the ILD layer, the first mask having a trench corresponding to an isolation cut region and exposing the first and second dummy gates and the ILD layer, the isolation cut region being a region of an isolation cut mask, and the gate cut region intersecting the isolation cut region;
   forming a second mask on the first mask and on the ILD layer exposed by the trench;
   removing the first and second dummy gates;
   removing the first and second masks such that the ILD layer remains on the STI layer; and
   filling regions left by the removed first and second dummy gates.

2. The method of claim 1, wherein the gate cut and the isolation cut regions are substantially perpendicular to each other.

3. The method of claim 1, wherein the first and second masks have different etch selectivities.

4. The method of claim 1, wherein forming the first mask comprises:
   depositing the first mask on the first and second dummy gates and on the ILD layer;
   depositing a first photoresist on the first mask, the first photoresist having an opening corresponding to the isolation cut region, and the opening exposing a portion of the first mask;
   etching the exposed portion of the first mask to form the trench; and
   removing the first photoresist.

5. The method of claim 1, wherein removing the first and second dummy gates comprises:
   depositing a second photoresist on the second mask, the second photoresist corresponding to the gate cut region such that a portion of the second mask outside of the gate cut region is exposed;
   removing the exposed portion of the second mask so as to expose the first and second dummy gates outside of the gate cut region;
   removing the second photoresist; and
   removing the first and second dummy gates such that the ILD layer corresponding to the gate cut region remains intact.

6. The method of claim 1, wherein the first mask is a hardmask.

7. The method of claim 1, wherein the second mask is a softmask.

8. The method of claim 1, wherein filling the regions left by the removed first and second dummy gates comprises filling the regions with SiN and/or SiO.

9. A method for forming a semiconductor device, the method comprising:
   forming a shallow trench isolation (STI) layer on a substrate;
   forming first and second dummy gates on the STI layer;
   forming an interlayer dielectric (ILD) layer on the STI layer, the ILD layer corresponding to a gate cut region and separating the first and second dummy gates;
   forming a first mask on the first and second dummy gates and on the ILD layer;
   forming a second mask on the first mask, the second mask corresponding to the gate cut region such that a portion of the first mask outside of the gate cut region is exposed;
   removing the exposed portion of the first mask and the second mask such that a portion of the first mask corresponding to the gate cut region remains on the ILD layer;
   removing the first and second dummy gates;
   removing the first mask such that the ILD layer remains on the STI layer; and
   filling regions left by the removed first and second dummy gates.

10. The method of claim 9, wherein forming the second mask on the first mask comprises:
    depositing the second mask on the first mask;
    depositing a first photoresist over the second mask, the first photoresist corresponding to the gate cut region such that a portion of the second mask outside the gate cut region is exposed;
    removing the exposed portion of the second mask so as to expose a portion of the first mask outside of the gate cut region; and
    removing the first photoresist.

11. The method of claim 9, wherein removing the exposed portion of the first mask and the second mask comprises:
    depositing a second photoresist on the second mask, the second photoresist corresponding to the gate cut region and having an opening exposing a part of the second mask corresponding to an intersection between the gate cut region and an isolation cut region;
    selectively removing the exposed portion of the first mask such that a portion of the first mask corresponding to the gate cut region below the second mask remains and the ILD layer below the first mask also remains; and
    removing the second photoresist; and
    removing the second mask such that the first mask corresponding to the gate cut region is exposed.

12. The method of claim 11, wherein the gate cut and the isolation cut regions are substantially perpendicular to each other.

13. The method of claim 9, wherein the first and second masks have different etch selectivities.

14. The method of claim 9, wherein the first mask is one of SiN and $SiO_2$ and the second mask is the other of the SiN and $SiO_2$.

15. The method of claim 9, wherein filling the regions left by the removed first and second dummy gates comprises filling the regions with SiN and/or SiO.

* * * * *